United States Patent
Lee

(10) Patent No.: US 11,227,868 B2
(45) Date of Patent: Jan. 18, 2022

(54) SEMICONDUCTOR DEVICE INCLUDING AN ANTI-FUSE AND METHOD FOR FABRICATING THE SAME

(71) Applicant: SK hynix Inc., Gyeonggi-do (KR)

(72) Inventor: Dong-Hyun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/713,391

(22) Filed: Dec. 13, 2019

(65) Prior Publication Data
US 2020/0212054 A1    Jul. 2, 2020

(30) Foreign Application Priority Data
Dec. 28, 2018 (KR) .................. 10-2018-0171738

(51) Int. Cl.
| | | |
|---|---|---|
| *H01L 23/52* | (2006.01) | |
| *H01L 21/82* | (2006.01) | |
| *H01L 27/112* | (2006.01) | |
| *H01L 23/525* | (2006.01) | |

(52) U.S. Cl.
CPC .... *H01L 27/11206* (2013.01); *H01L 23/5252* (2013.01)

(58) Field of Classification Search
CPC .................. H01L 27/11206; H01L 23/5252
USPC .................. 438/130–132; 257/529, 530
See application file for complete search history.

(56) References Cited

U.S. PATENT DOCUMENTS

| | | | |
|---|---|---|---|
| 8,049,299 B2 | 11/2011 | Min et al. | |
| 8,742,457 B2 | 6/2014 | Yang | |
| 9,165,936 B2 * | 10/2015 | Ponoth | ............. H01L 29/66795 |
| 9,257,345 B2 * | 2/2016 | Sung | ..................... H01L 22/22 |
| 9,305,786 B2 * | 4/2016 | Jung | ................... H01L 27/108 |
| 9,443,860 B1 * | 9/2016 | Sung | ................ H01L 27/11206 |
| 9,627,390 B2 * | 4/2017 | Choi | .................. H01L 23/5252 |
| 9,659,943 B1 | 5/2017 | Tran et al. | |

* cited by examiner

Primary Examiner — Calvin Lee
(74) Attorney, Agent, or Firm — IP & T Group LLP

(57) ABSTRACT

A semiconductor device includes a trench formed in a substrate; an active region defined in the substrate by the trench; a trench-based dielectric material formed in the trench, and including a rupture portion contacting an edge of the active region; a first conductive plug formed on the trench-based dielectric material so as to contact the rupture portion; and a gate structure including a gate dielectric layer formed on the active region and a gate electrode formed on the gate dielectric layer.

17 Claims, 25 Drawing Sheets

SEMICONDUCTOR DEVICE INCLUDING AN ANTI-FUSE AND METHOD FOR FABRICATING THE SAME

CROSS-REFERENCE TO RELATED APPLICATIONS

The present application claims priority to Korean Patent Application No. 10-2018-0171738, filed on Dec. 28, 2018, which is incorporated herein by reference in its entirety.

BACKGROUND

1. Field

The present invention relates generally to a semiconductor device technology and, more particularly, to an improved anti-fuse, semiconductor device employing the anti-fuse and to methods for fabricating the anti-fuse and the semiconductor device.

2. Description of the Related Art

An electrical programmable fuse (hereinafter abbreviated as an "e-fuse") is used to perform a function of storing or repairing specific information in a semiconductor integrated circuit device. The e-fuse may include a gate dielectric rupture fuse element. The gate dielectric rupture fuse element may be referred to as an "anti-fuse".

Recently, an array rupture e-fuse (ARE) circuit is mainly used. The ARE may include anti-fuses arranged in an array form. Each of the anti-fuses may include a select transistor and a program transistor. A program operation of the anti-fuse may be achieved by rupturing a gate dielectric layer of the program transistor.

SUMMARY

Various embodiments of the present invention may include an anti-fuse having a reduced size, a semiconductor device including the anti-fuse, and methods for fabricating the anti-fuse and the semiconductor device.

In accordance with an embodiment, a semiconductor device includes: a trench formed in a substrate; an active region defined in the substrate by the trench; a trench-based dielectric material formed in the trench, and including a rupture portion contacting an edge of the active region; a first conductive plug formed on the trench-based dielectric material so as to contact the rupture portion; and a gate structure including a gate dielectric layer formed on the active region and a gate electrode formed on the gate dielectric layer.

In accordance with an embodiment, a method for fabricating a semiconductor device includes: forming a trench to define an active region in a substrate; filling the trench with a dielectric material; forming a gate structure on the active region, the gate structure including a gate dielectric layer and a gate electrode which are sequentially stacked therein; forming a spacer on both sidewalls of the gate structure; etching a portion of the dielectric material to be self-aligned with a sidewall of the spacer, in order to form a rupture portion contacting an edge of the active region; and forming a conductive plug contacting the rupture portion.

In accordance with an embodiment, an anti-fuse includes: a substrate; a trench formed in the substrate; an active region defined in the substrate by the trench; a dielectric material formed in the trench, and including a rupture portion contacting an edge of the active region; a conductive plug formed on the dielectric material so as to contact the rupture portion; and a select transistor on the substrate, and the select transistor is coupled to the rupture portion.

DETAILED DESCRIPTION

Figure 1:
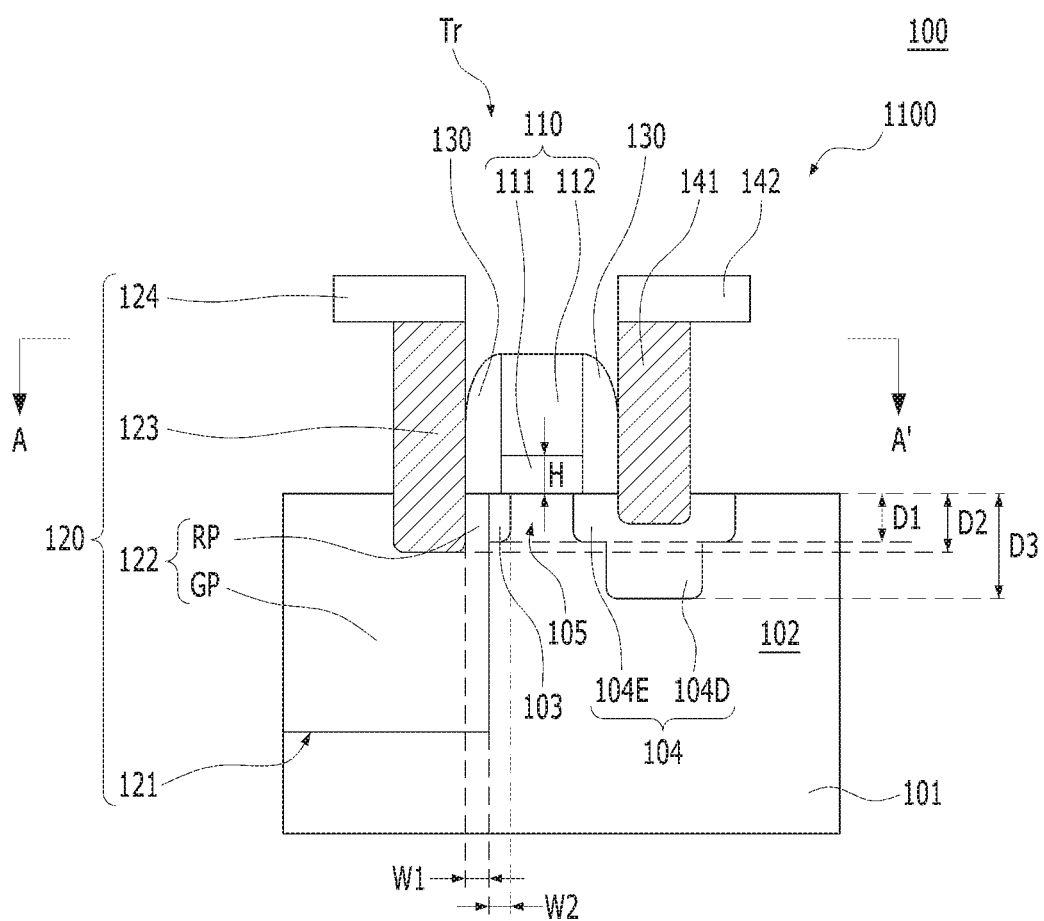
FIG. 1 is a cross-sectional view illustrating a semiconductor device in accordance with an embodiment of the present invention.

Hereinafter, various embodiments of the present invention are described below in more detail with reference to the accompanying drawings in order to facilitate those skilled in the art to which this invention pertains to easily carry out the technical idea of the present invention.

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

It will be further understood that when an element is referred to as being "connected to", or "coupled to" another element, it may be directly on, connected to, or coupled to the other element, or one or more intervening elements may be present. Furthermore, the connection/coupling may not be limited to a physical connection but may also include a non-physical connection, e.g., a wireless connection.

In addition, it will also be understood that when an element is referred to as being "between" two elements, it may be the only element between the two elements, or one or more intervening elements may also be present.

As used herein, singular forms are intended to include the plural forms as well, unless the context clearly indicates otherwise. The articles 'a' and 'an' as used in this application and the appended claims should generally be construed to mean 'one or more' unless specified otherwise or clear from context to be directed to a singular form.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

It should be understood that the drawings are simplified schematic illustrations of the described devices and may not include well known details for avoiding obscuring the features of the invention.

It should also be noted that features present in one embodiment may be used with one or more features of another embodiment without departing from the scope of the invention.

It is further noted, that in the various drawings, like reference numbers designate like elements.

Rupture or breakdown of a gate dielectric layer is a mainstream technique used in an anti-fuse. Generally, a conventional anti-fuse requires two transistors (2T), a select transistor and a program transistor. The anti-fuse may use the select transistor for selecting and accessing the program transistor when the program transistor is to be programmed and may rupture the gate dielectric layer of the program transistor for programming the selected program transistor. Unlike the aforementioned conventional anti-fuse, in accordance with embodiments described below, a single transistor anti-fuse (1-T anti-fuse) is provided. In an embodiment, the 1-T anti-fuse may include one select transistor, a trench-based dielectric material and a conductive plug. The trench-based dielectric material may be made of a dielectric material. Any suitable dielectric material may be used. The trench-based dielectric material may be ruptured by a voltage applied through the conductive plug. The trench-based dielectric material may be formed by a shallow trench isolation (STI) process.

An anti-fuse in accordance with various embodiments of the present invention may rupture a trench-based dielectric material as a programming mechanism. An anti-fuse in accordance with various embodiments of the present invention utilizes a shallow trench isolation (STI) rupture as the programming mechanism and does not require an additional program transistor for rupture. An anti-fuse in accordance with various embodiments of the present invention may use a conductive plug for the rupture.

The anti-fuse in accordance with various embodiments of the present invention may be fabricated using standard CMOS processes. For example, a process of fabricating the anti-fuse may include fabricating the select transistor of the anti-fuse and the trench-based dielectric material and landing a conductive plug on the shallow trench dielectric material. The use of the trench-based dielectric material for the rupture instead of a gate dielectric layer of a program transistor may reduce substantially the size of the anti-fuse and thereby also improve the integration density a semiconductor device employing the anti-fuse.

Figure 2:
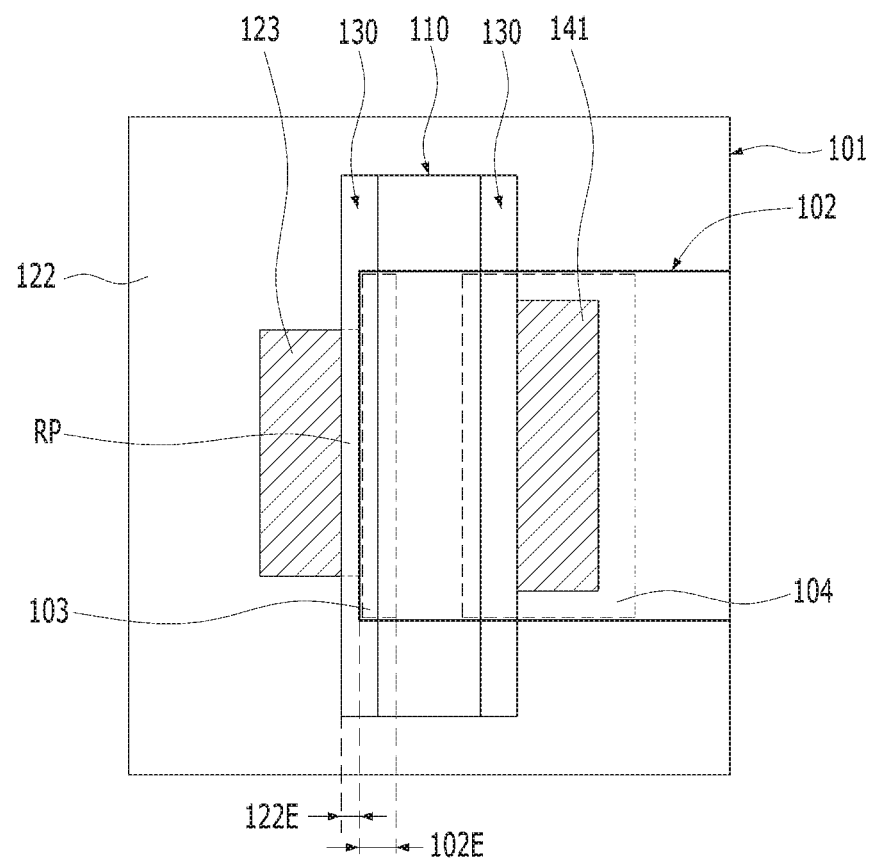
FIG. 2 is a plan view illustrating the semiconductor device taken along an A-A' line shown in FIG. 1.
Figure 3A:
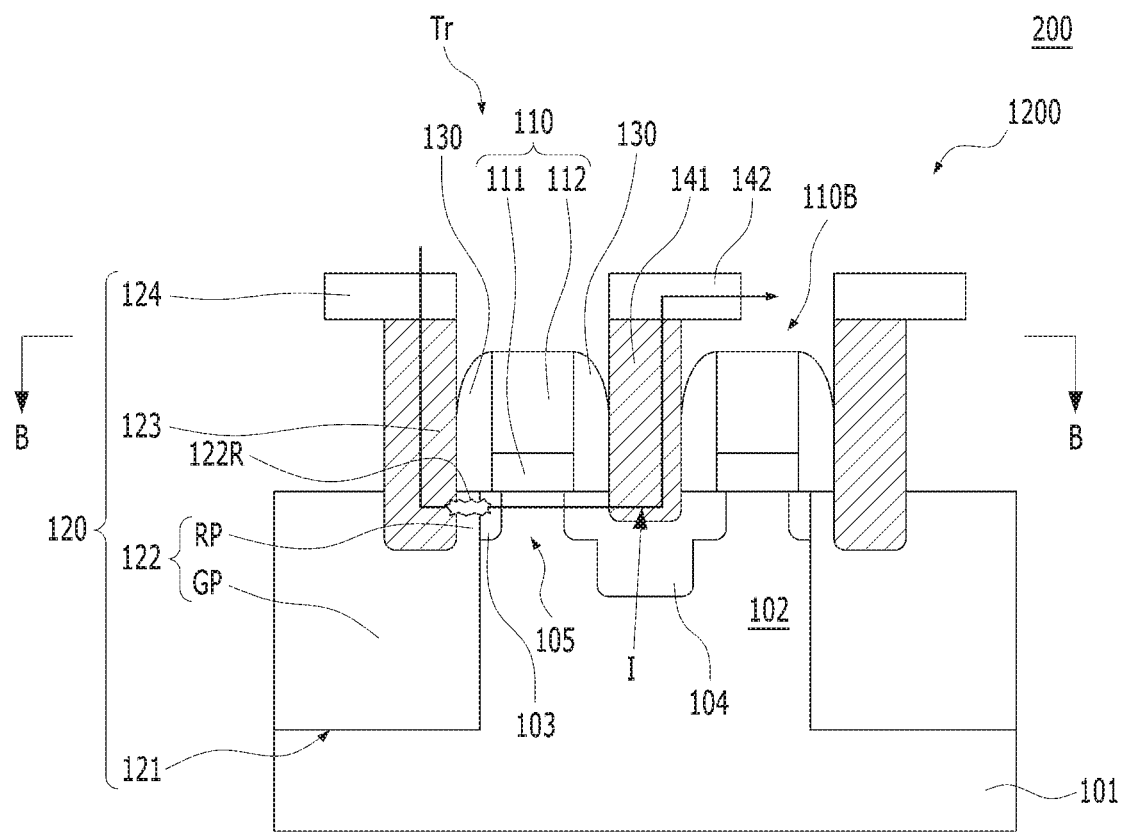
FIG. 3A is a cross-sectional view illustrating a semiconductor device in accordance with an embodiment of the present invention.
Figure 3B:
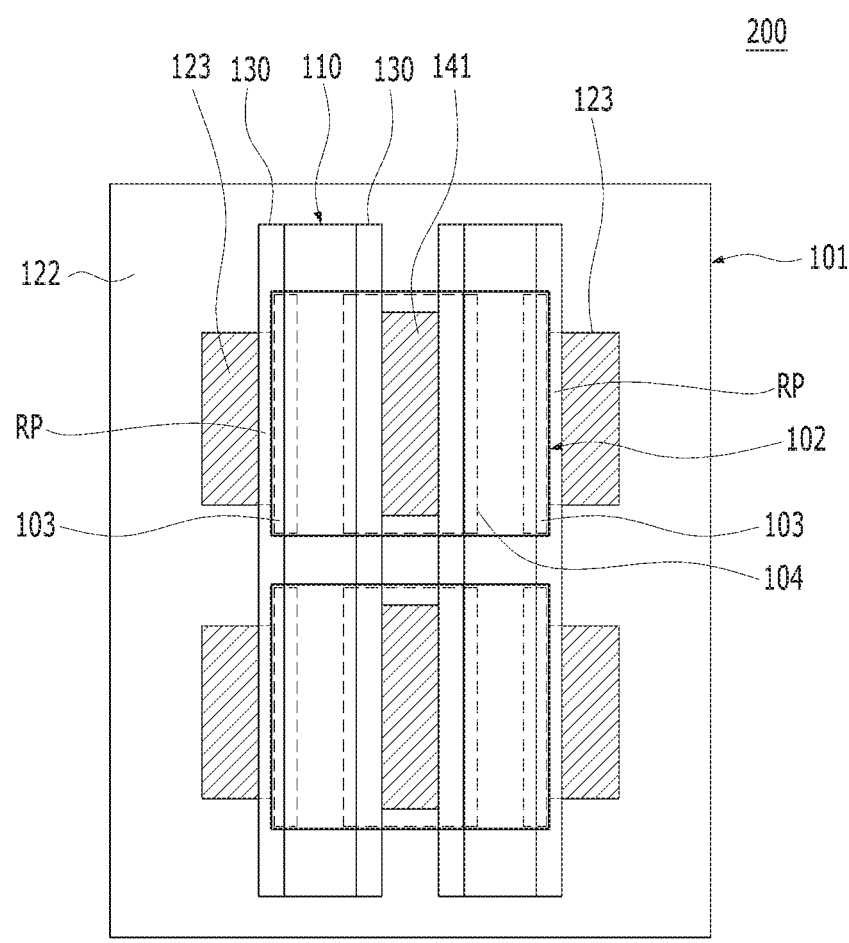
FIG. 3B is a plan view illustrating the semiconductor device taken along a B-B' line shown in FIG. 3A.
Figure 4:
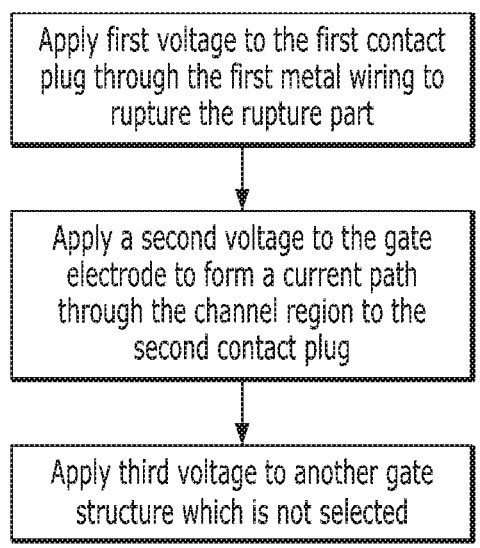
FIG. 4 is a flowchart of an operation method of a semiconductor device, according to an embodiment of the present invention.

FIG. 1 is a cross-sectional view illustrating a semiconductor device 100 in accordance with an embodiment of the present invention. FIG. 2 is a plan view taken along an A-A' line of FIG. 1. FIG. 3A is a cross-sectional view illustrating a semiconductor device 200 in accordance with an embodiment of the present invention. FIG. 3B is a plan view taken along a B-B' line of FIG. 3A. FIG. 4 is a flowchart of an operation method of a semiconductor device, according to an embodiment of the present invention. The semiconductor device 100 shown in FIGS. 1 and 2 may include an anti-fuse 1100, and the semiconductor device 200 shown in FIGS. 3A and 3B may include an anti-fuse array 1200. The anti-fuse array 1200 may have two anti-fuses 1100 shown in FIGS. 1 and 2, and each of the respective anti-fuses of the anti-fuse array 1200 may have the same structure.

The semiconductor device 100 shown in FIGS. 1 and 2 may include the anti-fuse 1100. The semiconductor device 100 may include a substrate 101, a gate structure 110 formed on the substrate 101 and a rupture structure 120 formed in the substrate 101 and including a dielectric material which is ruptured. The rupture structure 120 may include a trench 121 formed in the substrate 101, a trench-based dielectric material 122 filling the trench 121, a first contact plug 123 formed on the trench-based dielectric material 122 and a first metal wiring 124 formed on the first contact plug 123. In some embodiments, the first metal wiring 124 may be omitted, hence, in those embodiments all the features of FIG. 1 described so far may be formed except for the first metal wiring 124.

The trench-based dielectric material 122 may include a gap-fill portion GP and a rupture portion RP. The gap-fill portion GP may fill a lower portion of the trench 121, and the rupture portion RP may cover an upper sidewall of the trench 121. The height of the rupture portion RP may be smaller than that of the gap-fill portion GP. The width of the rupture portion RP may be smaller than that of the gap-fill portion GP. The rupture portion RP may be defined as an edge of the trench-based dielectric material 122 (hereinafter abbreviated as a "dielectric material edge 122E").

The trench-based dielectric material 122 may preferably include oxide, nitride or a combination thereof. The trench-based dielectric material 122 may, for example, include silicon oxide, silicon nitride or a combination thereof. The trench-based dielectric material 122 may include high-density plasma (HDP) oxide. The trench-based dielectric material 122 may be an isolation layer formed by the STI process. A portion of the isolation layer formed by the STI process may be defined as the rupture portion RP.

The first contact plug 123 and the first metal wiring 124 may be made of any suitable conductive materials. The first contact plug 123 may be a conductive plug, and a rupture program voltage may be applied thereto. The first contact plug 123 and the first metal wiring 124 may be made of the same material or different materials. The first contact plug 123 may, for example, include polysilicon, doped polysilicon, a metal, metal nitride, metal carbide, metal silicide or any combinations thereof. The first metal wiring 124 may, for example, include a metal, metal nitride, metal carbide, metal silicide or any combinations thereof. A lower portion of the first contact plug 123 may extend into the trench-based dielectric material 122. The lower portion of the first contact plug 123 may directly contact the rupture portion RP of the trench-based dielectric material 122. The first contact plug 123 may have a smaller width than the trench 121. The first contact plug 123 may have an elongated shape with its lengthwise axis extending in a direction vertical to the plane of the substrate 101 (also referred to herein as the vertical direction). The first contact plug 123 may be formed on the trench-based dielectric material 122 with a lower portion thereof extending inside un upper portion of the trench-based dielectric material 122. The first metal wiring 124 may have an elongated shape with its lengthwise axis extending in parallel with the plane of the substrate 101. The lengthwise axis of the first metal wiring 124 may extend perpendicularly to the first contact plug 123. The first metal wiring 124 may directly contact the first contact plug 124. The first metal wiring 124 may be positioned above the first contact plug 123. As can be seen in the illustrated embodiment of FIG. 1, a portion of the first contact plug 123 which extends into the substrate 101 may be coextensive in the vertical direction with the rupture portion RP of the trench-based dielectric material 122.

An active region 102 may be defined in the substrate 101 by the trench 121. The active region 102 may have an island shape.

The gate structure 110 may be formed over the active region 102. The gate structure 110 may be formed over the active region 102 to overlap with a portion of the active region 102. The gate structure 110 may include a gate dielectric layer 111 formed over the active region 102 of the substrate 101 and a gate electrode 112 formed over the gate dielectric layer 111. The gate structure 110 may include a gate dielectric layer 111 formed on the active region 102 of the substrate 101 and a gate electrode 112 on the gate dielectric layer 111. The gate dielectric layer 111 may, for example, include silicon oxide. In some embodiments, the gate dielectric layer 111 may include a high-k dielectric material or a stack of at least one layer of a silicon oxide and a layer of a high-k dielectric material, wherein k stands for dielectric constant. Examples of suitable high-k dielectric materials may include titanium dioxide, tantalum pentoxide, cerium dioxide, aluminum oxide and the like. "The gate electrode 112 may be made of any suitable conductive material including, for example, polysilicon, doped polysilicon, a metal, metal nitride, metal carbide, metal silicide or any combinations thereof. The gate electrode 112 may be formed in a single layer or multiple layers stacked on one another. For example, in an embodiment, the gate electrode 112 may have a structure in which doped polysilicon, titanium nitride (TIN) and tungsten (W) are sequentially stacked.

The semiconductor device 100 may further include first and second spacers 130 formed on the sidewalls of the gate structure 110. Each spacer 130 may completely cover a respective sidewall of the gate structure 110. Each spacer 130 may not extend over a top surface of the gate structure 110. The spacers 130 may be made of any suitable dielectric material. The spacers 130 may, for example, include silicon oxide, silicon nitride or a combination thereof. A first spacer 130 may be located between the first contact plug 123 and the gate structure 110. A second spacer 130 may be located between the gate structure 110 and a second contact plug 141. One side of the first spacer 130 may directly contact the first contact plug 123, and the other side of the first spacer 130 may directly contact the sidewall of the gate structure 110, i.e., the sidewall of the gate electrode 112 and the sidewall of the gate dielectric layer 111. One side of the second spacer 130 may directly contact the second contact plug 141, and the other side of the first spacer 130 may directly contact the sidewall of the gate structure 110, i.e., the sidewall of the gate electrode 112 and the sidewall of the gate dielectric layer 111. The first and second spacers 130 may have an elongated shape with their respective lengthwise axis extending in parallel with the lengthwise axis of the first contact plug 123. A top surface of the first and second spacers 130 may be curved. A top surface of the first spacer 130 may be positioned at a lower level than a top surface of the first contact plug 123. A top surface of the second spacer 130 may be positioned at a lower level than a top surface of the second contact plug 141.

In the illustrated embodiment, a first side of each of the first and second spacers 130 which is in contact with the gate structure 110 may have a vertical profile while a second side of each of the first and the second spacers 130 may have a composite profile including a lower vertical profile portion and an upper curved portion. This composite profile may be referred to hereinafter as a rounding profile for simplicity. Accordingly, the upper curved portion of the first spacer 130 may not contact the first contact plug 123, or stated otherwise the second side of the first spacer 130 which has the rounding profile may only partially contact the first contact plug 123. Likewise, the upper curved portion of the second spacer 130 may not contact the second contact plug 141, or stated otherwise the second side of the second spacer 130 which has the rounding profile may only partially contact the second contact plug 141.

A bottom surface of the first spacer 130 may contact the rupture portion RP of the trench-based dielectric material 122. A first portion of the bottom surface of the spacer 130 may fully overlap with the rupture portion RP of the trench-based dielectric material 122. A second portion of the bottom surface of the first spacer 130 may contact an edge of the active region 102 which is an impurity region 103 and is described below in more detail. The first and second spacers may have the same shape and size, and may each cover a respective sidewall of the gate structure 110. The width of each of the first and the second spacers 130 may be the same as or preferably smaller than that of the first contact plug 123. As illustrated in FIG. 1, the width of each of the first and the second spacers 130 may be substantially smaller than that of the first contact plug 123. The height of each of the first and the second spacers 130 may be the same as that of the gate structure 110. The first and the second spacers 130 and the gate structure 110 may be coextensive in the vertical direction.

The first contact plug 123 may be self-aligned with one sidewall of the first spacer 130. Accordingly, a gap between the first contact plug 123 and the gate structure 110 may remain constant.

In addition, as the first contact plug 123 is self-aligned with the first spacer 130, a gap between the first contact plug 123 and the active region 102 may remain constant. Thus, the anti-fuse 1100 may operate stably.

As noted, the semiconductor device 100 may further include the second contact plug 141. A second metal wiring 142 may be formed on the second contact plug 141. The second contact plug 141 and the second metal wiring 142 may be made of any suitable conductive materials. The second contact plug 141 and the second metal wiring 142 may be made of the same material or different materials. The second contact plug 141 may, for example, include polysilicon, doped polysilicon, a metal, metal nitride, metal carbide, metal silicide or any combinations thereof. The second metal wiring 142 may, for example, include a metal, metal nitride, metal carbide, metal silicide or any combinations thereof. A lower portion of the second contact plug 141 may extend into the active region 102. The lower portion of the second contact plug 141 may be spaced apart from the rupture portion RP. The second contact plug 141 may contact the second spacer 130. The top surface of the second contact plug 141 may be at the same level as the top surface of the first contact plug 123. The bottom surface of the second contact plug 141 may be at a level higher than the bottom surface of the first contact plug 123. As can be seen in the illustrated embodiment of FIG. 1, the lower portion of the second contact plug 141 which extends into the substrate 101 may be smaller in length than the lower portion of the first contact plug 123 which extends into the substrate 101 so that the bottom surface of the second contact plug 141 may be at a higher level in the vertical direction than the bottom surface of the first contact plug. The gate structure 110 may be positioned centrally between the first and the second contact plugs 123 and 141 with the pair of the first and second spacers 130 separating the respective first and second contact plugs from the gate structure 110. The first and the second contact plugs 123 and 141 may generally have the same shape but the second contact plug 141 may be smaller in the vertical direction than the first contact plug 123. The second metal wiring 142 may have the same shape as the first metal wiring 124 and may positioned at the same level as the first metal wiring 124 while contacting the top surface of the second contact plug 142.

The semiconductor device 100 may further include the first impurity region 103 and a second impurity region 104 that are formed in the active region 102 of the substrate 101. The first and second impurity regions 103 and 104 may be spaced apart from each other in the horizontal direction with a channel region 105 disposed between them. The first impurity region 103 may directly contact the rupture portion RP of the trench-based dielectric material 122. The second impurity region 104 may contact the second contact plug 141. The second impurity region 104 may be formed around and below the lower portion of the second contact plug 141 which extends into the substrate 101. The first and second impurity regions 103 and 104 may include the same conductive type of impurity. The first and second impurity regions 103 and 104 may, for example, include an N-type impurity such as phosphorus and arsenic. The first and second impurity regions 103 and 104 may, for example, include a P-type impurity such as boron and indium. The first and second impurity regions 103 and 104 may have different depths and/or widths. Accordingly, the first and second impurity regions 103 and 104 may be asymmetrical. For example, the first impurity region 103 may have a smaller width than the second impurity region 104. The first impurity region 103 may have a smaller depth than the second impurity region 104. The first and second impurity regions 103 and 104 may be referred to as source and drain regions. The second impurity region 104 may include a shallow impurity region 104E and a deep impurity region 104D. The shallow impurity region 104E may have the same depth as the first impurity region 103. The shallow impurity region 104E may be formed around and below the lower portion of the second contact plug 141. The deep impurity region 104 D may be formed below the shallow impurity region 104E and may have a smaller width than the shallow impurity region 104E. The second impurity region 104 may be formed inside the substrate 101 symmetrically around a vertically extending axis of symmetry which is collinear with the vertical axis of symmetry of the second contact plug 141. The shallow impurity region 104E and the first impurity region 103 may be referred to as lightly doped drains (LDD) or source/drain extension (SDE).

The first impurity region 103 may have a first depth D1. The shallow impurity region 104E of the second impurity region 104 may have the same first depth D1 as the first impurity region 103. The rupture portion RP may have a second depth D2 larger than the first depth D1 of the first impurity region 103 (D2>D1). The deep impurity region 104D of the second impurity region 104 may have a third depth D3 larger than the first depth D1 of the first impurity region 103 (D3>D1). The deep impurity region 104D of the second impurity region 104 may have a third depth D3 larger than the second depth D2 of the rupture portion RP (D3>D2). In some embodiments, the first impurity region 103 and the rupture portion RP may have the same depth.

The width of the rupture portion RP (refer to reference numeral 'W1') may be equal to that of the first impurity region 103 (refer to reference numeral 'W2'). Thus, for example, as illustrated in the embodiment of FIG. 1 the width of the rupture portion RP W1 may be equal to the width of the first impurity region 103 (W2). The gate dielectric layer 111 and the rupture portion RP may have the same or different thicknesses. The gate dielectric layer 111 and the rupture portion RP may have different thicknesses. Preferably, the thickness H of the gate dielectric layer 111 may be larger than the thickness of the rupture portion RP.

Preferably, the thickness H of the gate dielectric layer 111 may be larger than the width W1 of the rupture portion RP (H>W1). The rupture portion RP may be formed with a sufficiently small width (measured as W1 in the horizontal direction in FIG. 1) so that it can be easily ruptured. The gate dielectric layer 111 may be formed with a sufficient thickness (measured as the height "H" in FIG. 1) for preventing deterioration of transistor characteristics. For example, in an embodiment, the rupture portion RP may have a width W1 of from to 30 Å, and the gate dielectric layer 111 may have a thickness H of to 60 Å.

The first impurity region 103 may be formed on an edge of the active region 102 (hereinafter abbreviated as an "active region edge 102E"). The active region edge 102E may directly contact the rupture portion RP and the spacer 130. The spacer 130 may have a larger width than the active region edge 102E. A lower portion of the rupture portion RP may be disposed laterally between the lower portion of the first conductive plug 123 and the active region edge 102E. The rupture portion RP may be directly contact with the lower portion of the first conductive plug and is not in contact with the active region edge 102E.

The first impurity region 103, the second impurity region 104 and the gate structure 110 may constitute a transistor Tr. The transistor Tr may be referred to as a select transistor.

Each of the first and second impurity region 103 and 104 may include an N-type impurity. In an embodiment, each of the first and second impurity region 103 and 104 may include, for example, arsenic. The first contact plug 123 may include polysilicon doped with an N-type impurity. In an embodiment, the first contact plug 123 may include polysilicon doped with an N-type impurity for example, arsenic. The gate electrode 112 may, for example, include polysilicon doped with phosphorous. In an embodiment, a channel region 105 and the substrate 101 may be doped with boron.

The rupture portion RP and the first contact plug 123 may serve as a program transistor. For example, the first contact plug 123 may be driven as a program gate for rupturing the rupture portion RP, and the gate structure 110 may be driven as a select gate.

An operation of the anti-fuse array 1200 shown in FIGS. 3A, 3B, and 4 is described as follows.

When a first voltage, i.e., a program voltage, is applied to the first contact plug 123 through the first metal wiring 124, the rupture portion RP may be ruptured (refer to reference numeral '122R') to perform a program operation (step 10). Subsequently, when a second voltage is applied to the gate electrode 112 of the gate structure 110, the channel region 105 is formed between the first impurity region 103 and the second impurity region 104. A current path (refer to reference numeral 'I') is formed through the channel region 105 and transferred to the second contact plug 141 (step 20). At this time, a third voltage is applied to another gate structure 110B which is not selected (step 30). The first voltage may be higher than the second and third voltages, and the second voltage may be higher than the third voltage. In an embodiment, the third voltage may be 0V, and the first voltage may be equal to or higher than 4.5V.

As described above, the semiconductor device 100 in accordance with the present embodiment may have a single transistor 1-T anti-fuse structure. Hence, "1-T" refers to a single transistor Tr anti-fuse while 2-T anti-fuse (also referred to as a 2-T-based anti-fuse array) refers to an anti-fuse employing two transistors.

Figure 5:
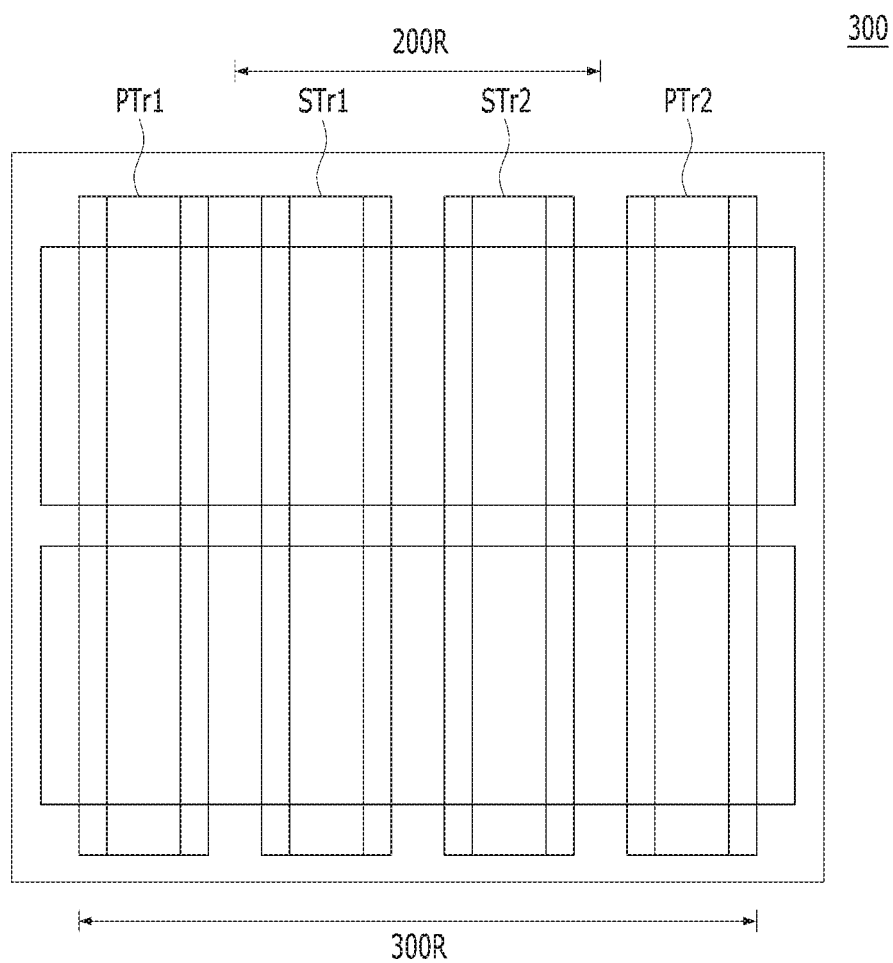
FIG. 5 is a diagram for describing a 2-T-based anti-fuse array according to a comparative example.

FIG. 5 is a diagram for describing a 2-T-based anti-fuse array 300 according to a comparative example.

Referring to FIG. 5, the 2T-based anti-fuse array 300 according to the comparative example may be constituted of program transistors PTr1 and PTr2 and select transistors STr1 and STr2.

For example, one anti-fuse may be constituted of two transistors, i.e., the program transistor PTr1 and the select transistor STr1. A gate dielectric layer of the program transistor PTr1 has to be formed thin so as to be easily broken down or ruptured, and a gate dielectric layer of the select transistor STr1 has to be formed to no less than a predetermined thickness for reliability. Accordingly, a space is required between the program transistor PTr1 and the select transistor STr1. Consequently, an occupied area 300R of the anti-fuse array 300 is inevitably increased by the program transistor PTr1.

By contrast, since the anti-fuse 1100 in accordance with the present embodiment includes only one select transistor Tr, an occupied area of the anti-fuse 1100 may be reduced substantially. Moreover, the first contact plug 123 of the present invention is smaller in size than the program transistor PTr1 of the 2T-based anti-fuse array 300, the occupied area of the anti-fuse 1100 may be further reduced. Also, since the first contact plug 123 is located on the trench-based dielectric material 122, it is not necessary to allocate additional space for forming the first contact plug 123. In addition, an occupied area (refer to reference numeral '200R') of the anti-fuse array 1200 in accordance with the present embodiment may be smaller than the occupied area (refer to reference numeral '300R') of the anti-fuse array 300 according to the comparative example.

Since the rupture portion RP and the gate dielectric layer 111 are formed by different processes, the rupture portion RP may be formed so thin as to easily break down, and the gate dielectric layer 111 may be formed so thick as to improve the reliability of the select transistor.

Since the rupture portion RP is formed using the isolation layer formed by the STI process, that is, a program transistor fabricating process is not required separately, the process may be simplified.

Since the active region in which the first contact plug 123 is to be landed can be omitted, the size of the active region 102 may be reduced.

Figure 6:
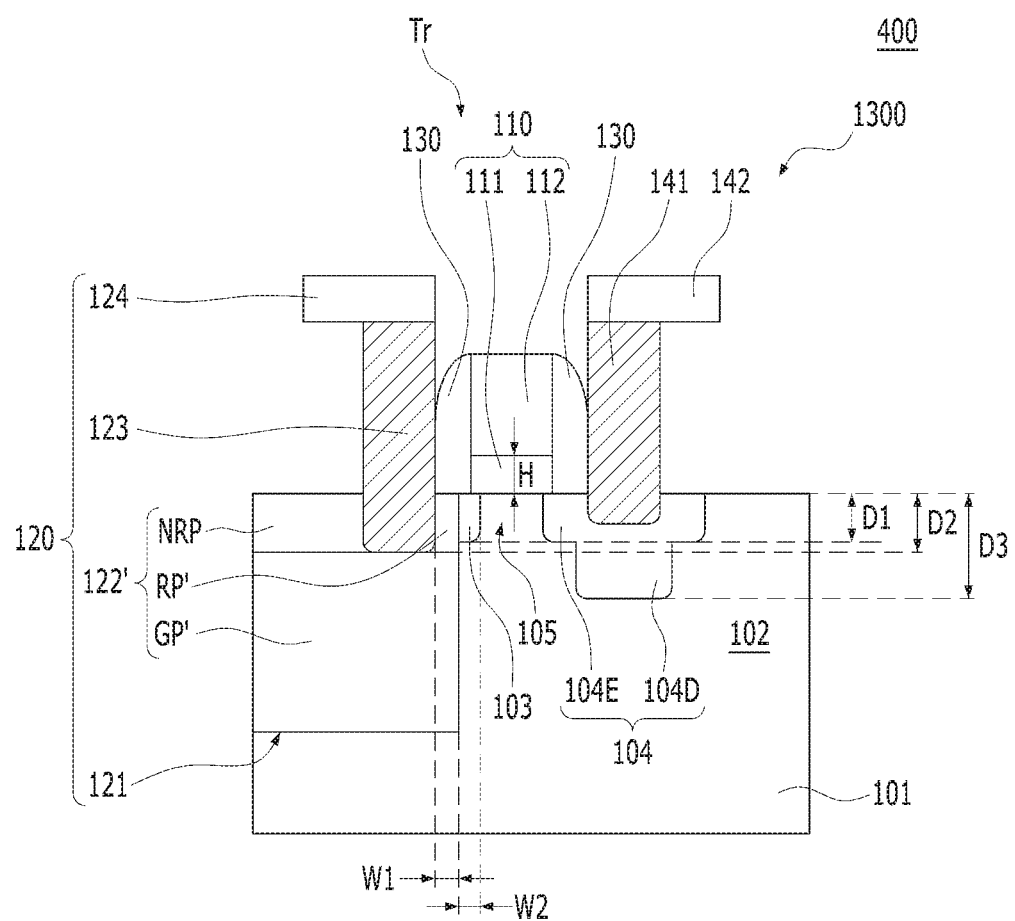
FIG. 6 is a cross-sectional view illustrating an anti-fuse in accordance with an embodiment of the present invention.

FIG. 6 is a cross-sectional view illustrating an anti-fuse in accordance with an embodiment of the present invention.

Referring to FIG. 6, a semiconductor device 400 may include an anti-fuse 1300. The anti-fuse 1300 may include a rupture structure 120 and a gate structure 110. The other components of the semiconductor device 400, except for a trench-based dielectric material 122' of the rupture structure 120, may be understood with reference to FIGS. 1 to 4 described above.

Referring to FIG. 6, the trench-based dielectric material 122' may include a gap-fill portion GP' filling a trench 121 and a rupture portion RP' on the gap-fill portion GP'. The rupture portion RP' may cover an upper sidewall of the trench 121. The rupture portion RP' may contact the first impurity region 103 of the transistor Tr and the first contact plug 123. The rupture portion RP' may cover the space between the sidewall of the lower portion of the first contact plug 123 which extends into the substrate 101 and the upper sidewall of the trench 121 which is adjacent to the impurity region 103 of the transistor Tr. The rupture portion RP' may be discontinuous from the gap-fill portion GP'. In other words, an interface may exist between the gap-fill portion GP' and the rupture portion RP'. The gap-fill portion GP' and the rupture portion RP' may be formed by different processes, respectively. The gap-fill portion GP' and the rupture portion RP' may be formed of different materials or of the same material. The trench-based dielectric material 122' may further include a non-rupture portion NRP. The non-rupture portion NRP may contact the other sidewall of the lower portion of the first contact plug 123 which extends into the substrate 101 and which is not contacted by the rupture portion RP'. The non-rupture portion NRP and the rupture portion RP' may be made of the same material. The non-rupture portion NRP may be wider than the rupture portion RP'.

Figure 7:
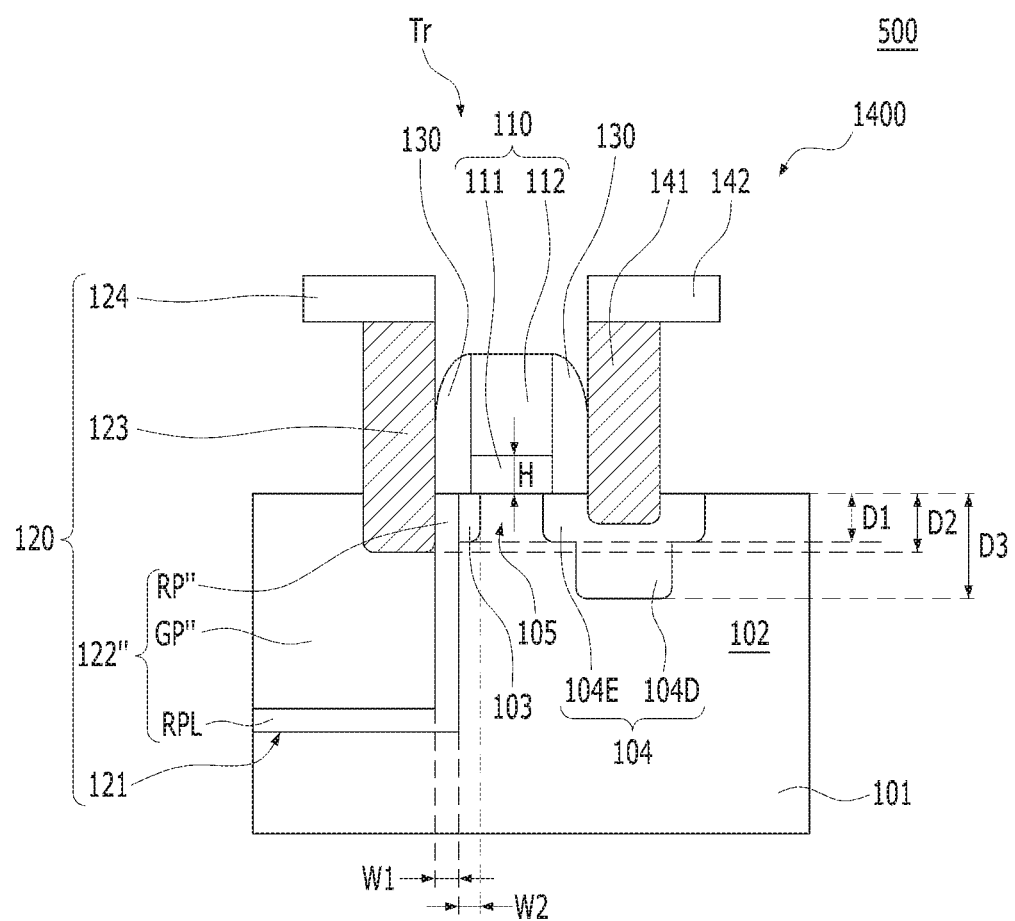
FIG. 7 is a cross-sectional view illustrating an anti-fuse in accordance with an embodiment of the present invention.

FIG. 7 is a cross-sectional view illustrating an anti-fuse in accordance with an embodiment of the present invention.

Referring to FIG. 7, a semiconductor device 500 may include an anti-fuse 1400, and the anti-fuse 1400 may include a rupture structure 120 and a gate structure 110. The other components of the semiconductor device 500, except for a trench-based dielectric material 122" of the rupture structure 120, may be understood with reference to FIGS. 1 to 4 described above.

Referring to FIG. 7, the trench-based dielectric material 122" may include a liner portion RPL formed on an internal surface of the trench 121 and a gap-fill portion GP''' formed on the liner portion RPL to fill the trench 121. More specifically, the liner portion RPL may cover the bottom surface and at least one of the sidewalls of the trench 121. The at least one of the sidewalls of the trench 121 which is covered by the liner portion RPL may be the one adjacent to the impurity region 103 of transistor Tr. Although, not shown in FIG. 7, the liner portion RPL may cover the bottom surface and both of the sidewalls of the trench 121. The gap-fill portion GP''' and the liner portion RPL may be made of different materials or of the same material. A portion of the liner portion RPL may be defined as a rupture portion RP'''. The rupture portion RP''' may be a portion of the liner portion RPL, which contacts a first impurity region 103. The rupture portion RP''' may have a smaller thickness than the gate dielectric layer 111. The rupture portion RP''' may have the same width W1 as the first impurity region 103 (W1=W2). The rupture portion RP''' may have a larger depth than the first impurity region 103 (D2>D1). The rupture portion RP" may be coextensive in the vertical direction with the lower portion of the first contact plug 123 which extends into the substrate 101. In some embodiments, the rupture portion RP" and the first impurity region 103 may have the same depth.

FIGS. 8A to 8H are plan views for describing an example of a method for fabricating a semiconductor device in accordance with an embodiment of the present invention. FIGS. 9A to 9H are cross-sectional views taken along C-C' lines of FIGS. 8A to 8H. FIGS. 8A to 9H illustrate an example of the method for fabricating the semiconductor device shown in FIG. 1.

Figure 8A:
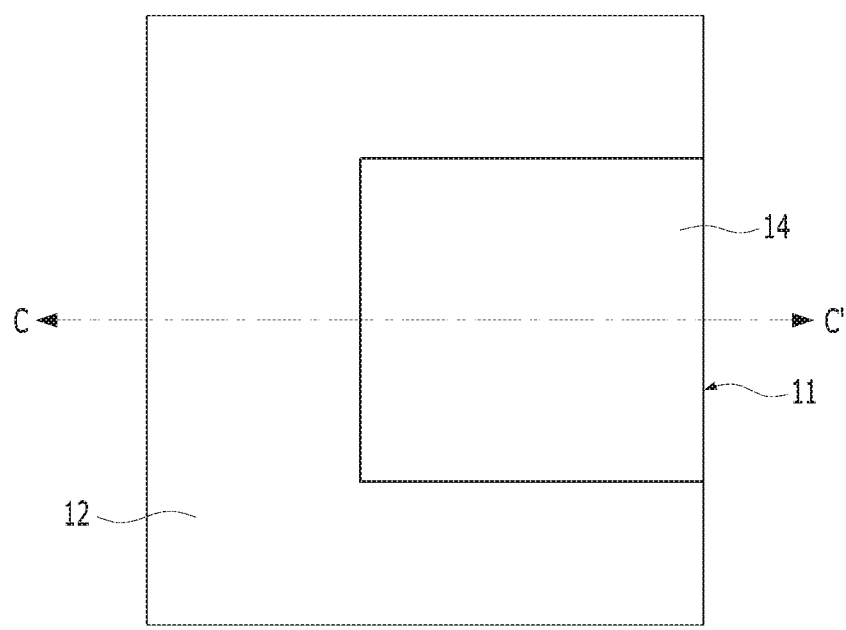
FIGS. 8A to 8H are plan views for describing an example of a method for fabricating a semiconductor device in accordance with an embodiment of the present invention.
Figure 9A:
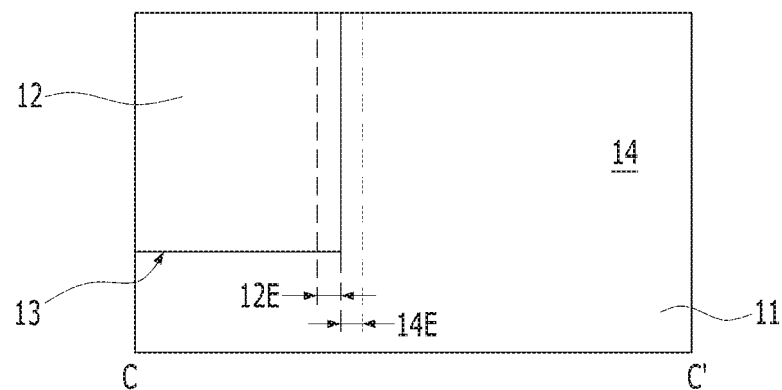
FIGS. 9A to 9H are cross-sectional views illustrating the semiconductor device taken along a C-C' line shown in FIGS. 8A to 8H.

Referring to FIGS. 8A and 9A, an isolation layer 12 may be formed in a substrate 11. The isolation layer 12 may be formed by the STI process. For example, a portion of the substrate 11 may be etched to form a trench 13, and the trench 13 may be filled with a dielectric material to form the isolation layer 12. The isolation layer 12 may define an active region 14 in the substrate 11. The active region 14 may include an active region edge 14E contacting the isolation layer 12. The isolation layer 12 may be made of any suitable dielectric material edge 12E contacting the active region edge 14E.

Figure 8B:
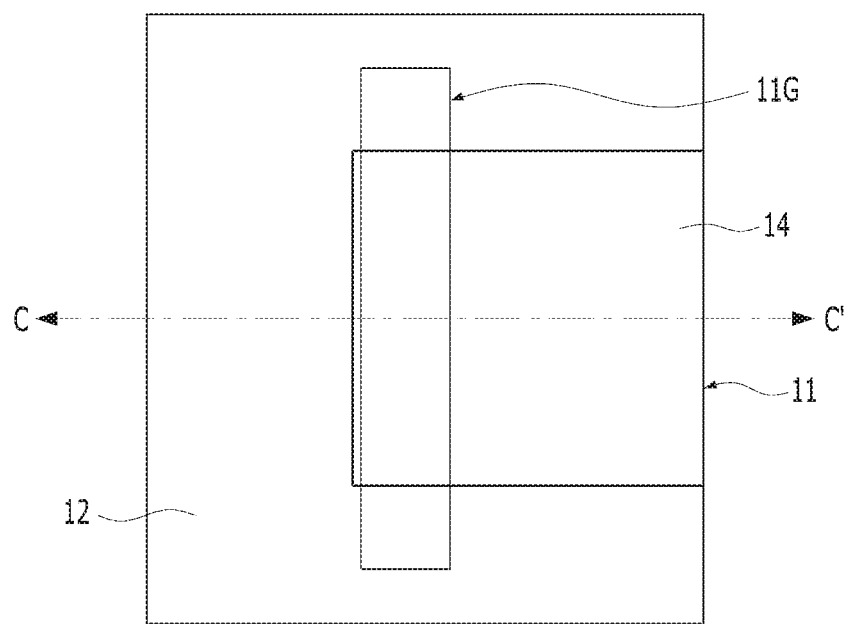
Figure 9B:
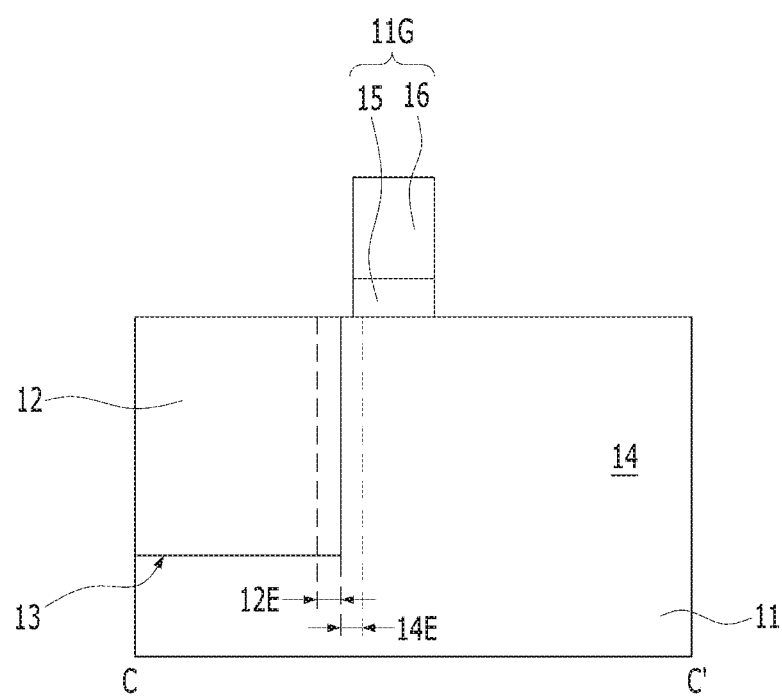

Referring to FIGS. 8B and 9B, a gate structure 11G may be formed on a surface of the substrate 11. The gate structure 11G may have a structure in which a gate dielectric layer 15 and a gate electrode 16 are sequentially stacked. The gate structure 11G may be formed on the active region 14 of the substrate 11. The gate structure 11G may not overlap with the isolation layer 12. The gate structure 11G may only partially overlap with the active region edge 14E.

Figure 8C:
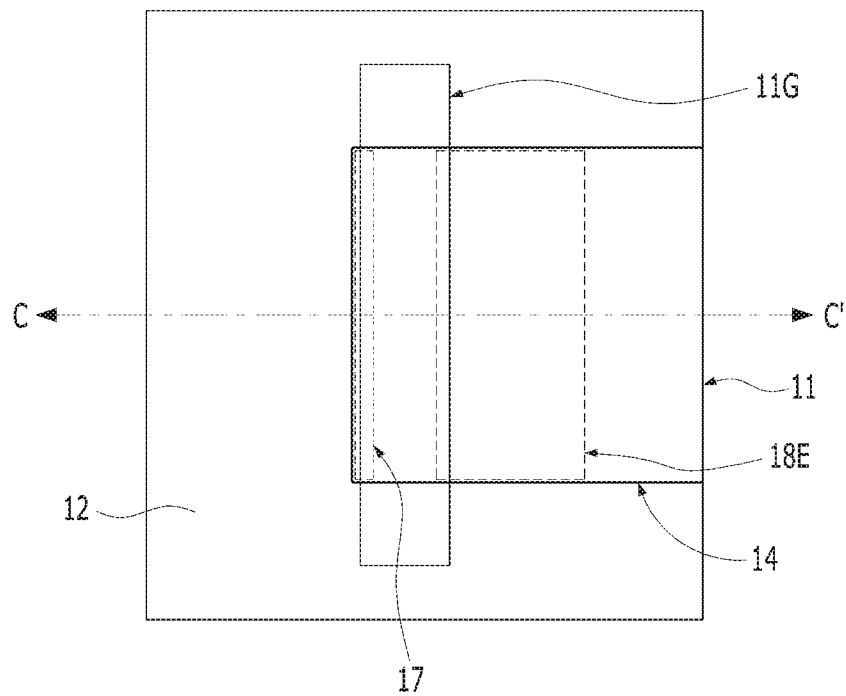
Figure 8D:
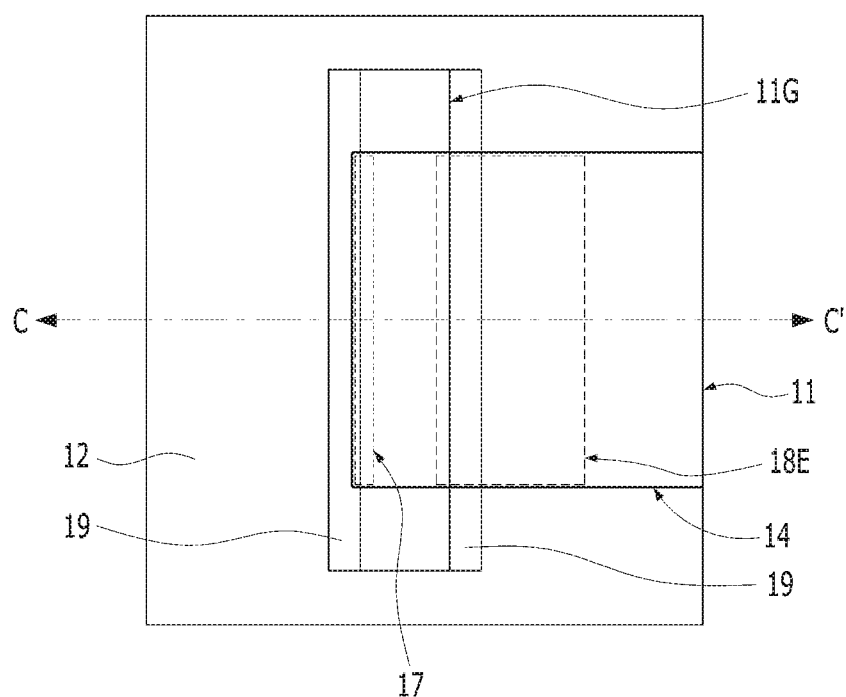
Figure 9C:
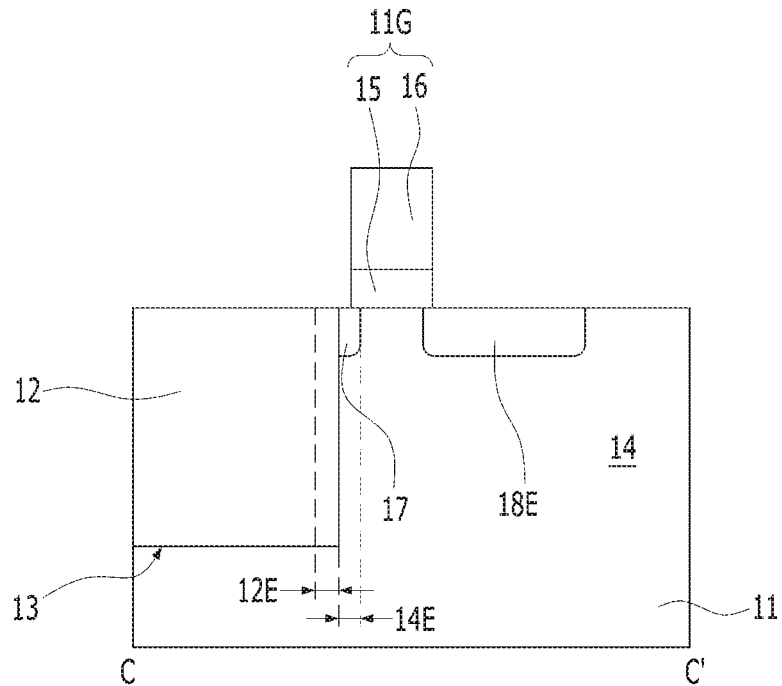
Figure 9D:
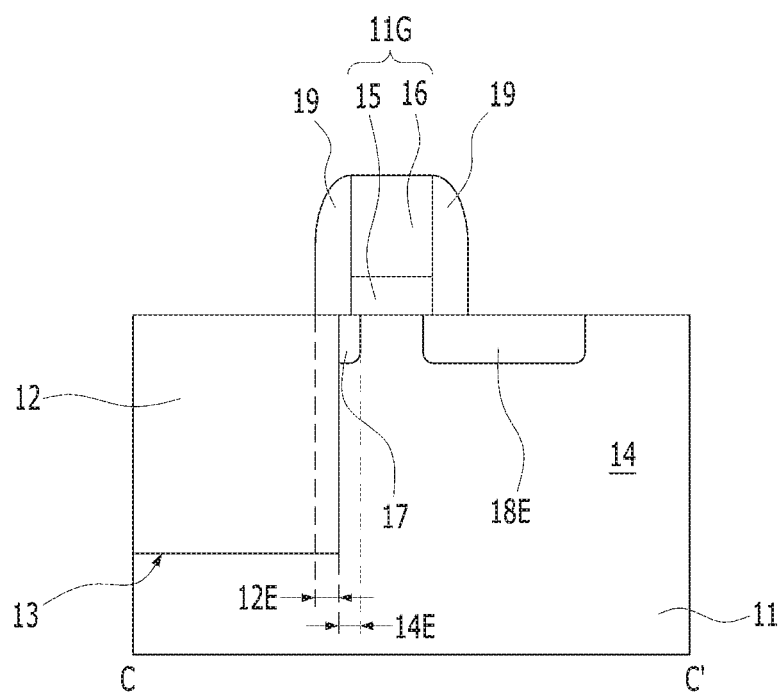

Referring to FIGS. 8C and 9C, an impurity doping process may be performed using the gate structure 11G as a barrier. A first impurity region 17 and a shallow impurity region 18E may be formed by the impurity doping process. The first impurity region 17 and the shallow impurity region 18E may include the same conductive type of impurity. The first impurity region 17 and the shallow impurity region 18E may have the same depth. The first impurity region 17 and the shallow impurity region 18E may have asymmetric shapes having different widths. The first impurity region 17 may be formed in the active region edge 14E. The first impurity region 17 may contact the dielectric material edge 12E. The first impurity region 17 may have a width equal to the width of the active region edge 14E. The shallow impurity region 18E may have a larger width than the width of the first impurity region 17. Referring to FIGS. 8D and 9D, a spacer 19 may be formed on both sidewalls of the gate structure 11G. The spacer 19 may include first and second spacers 19, each one formed on one the two sidewalls of the gate structure 11G. An etch-back process may be performed to form the first and second spacers 19 after a spacer material is deposited on the gate structure 11G. The spacers 19 may, for example, include silicon oxide, silicon nitride or a combination thereof. A bottom surface of the first spacer 19 may contact the first impurity region 17 of the active region edge 14E and the dielectric material edge 12E. A bottom surface of the second spacer 19 may contact the shallow impurity region 18E.

Figure 8E:
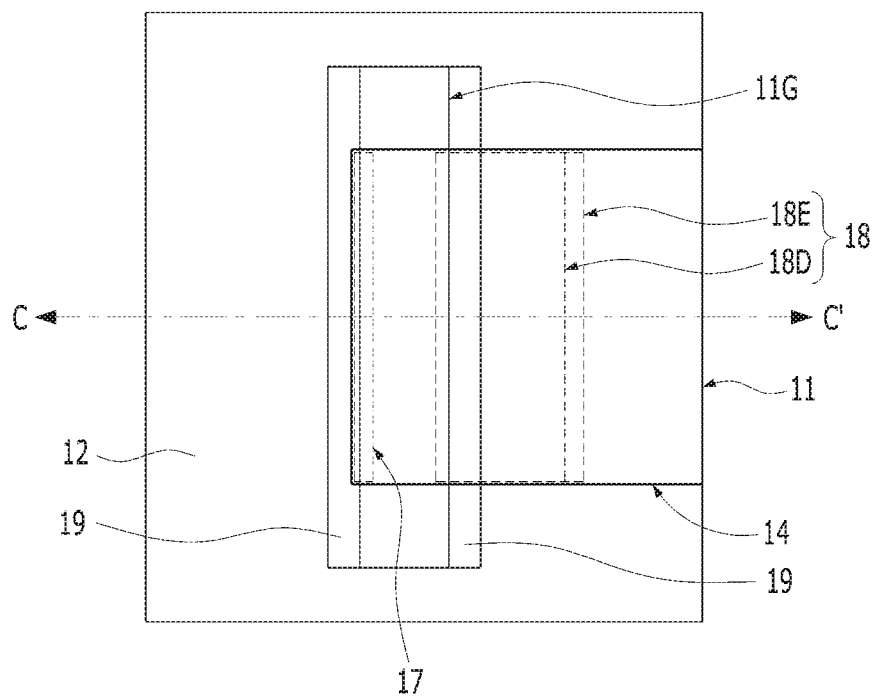
Figure 9E:
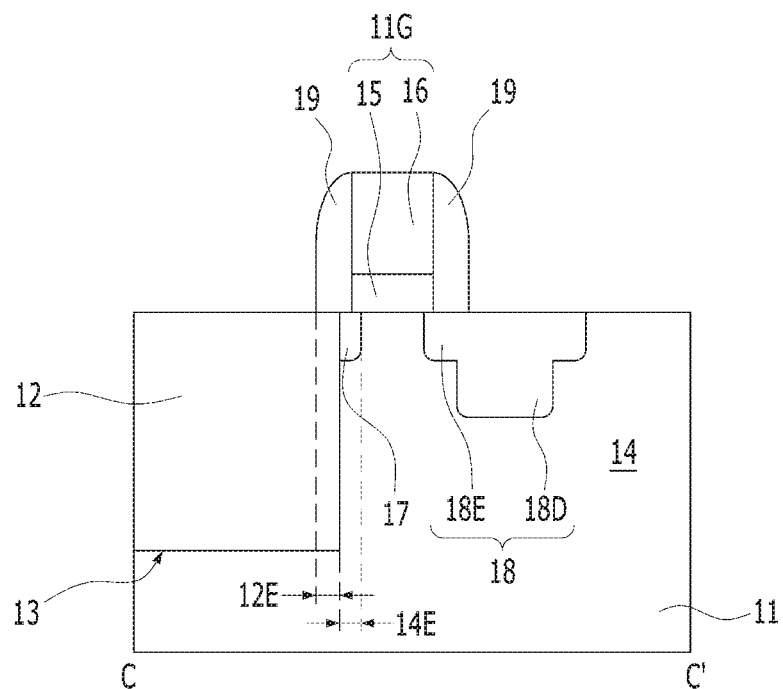

Referring to FIGS. 8E and 9E, an impurity doping process may be performed using the gate structure 11G and the spacer 19 as barriers to form a deep impurity region 18D. The deep impurity region 18D may include the same conductive type of impurity as the shallow impurity region 18E. The deep impurity region 18D may be deeper than the first impurity region 17 and the shallow impurity region 18E. The deep impurity region 18D may be spaced apart from the dielectric material edge 12E and the active region edge 14E.

The deep impurity region 18D and the shallow impurity region 18E may constitute a second impurity region 18. The first and second impurity regions 17 and 18 may have asymmetric shapes having different widths. The first and second impurity regions 17 and 18 may have asymmetric shapes having different depths.

Figure 8F:
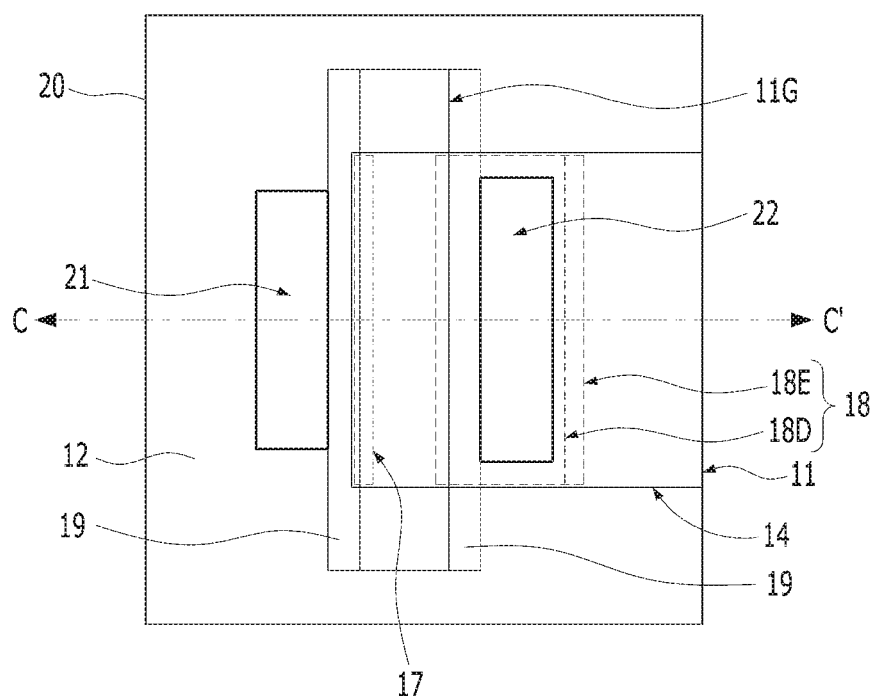
Figure 9F:
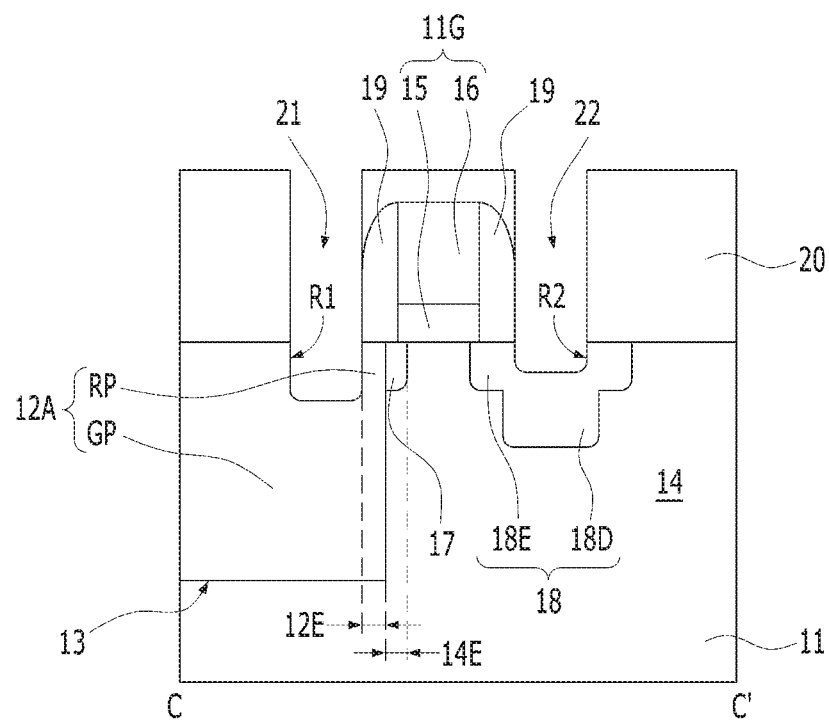

Referring to FIGS. 8F and 9F, an interlayer dielectric layer 20 may be formed on the spacer 19 and the gate structure 11G. The interlayer dielectric layer 20 may be formed of any suitable dielectric material. The interlayer dielectric layer 20 may, for example, include silicon oxide.

Subsequently, a contact mask layer (not illustrated) may be formed on the interlayer dielectric layer 20. The interlayer dielectric layer 20 may be etched using the contact mask layer as an etch barrier to form contact holes 21 and 22. The isolation layer 12 and the second impurity region 18 below the contact holes 21 and 22 may be partially etched to extend the contact holes 21 and 22 downwardly.

The contact holes 21 and 22 may be referred to as the first contact hole and the second contact hole 22. The first contact hole 21 may be landed on a surface of the isolation layer 12, and the second contact hole 22 may be landed on a surface of the second impurity region 18. The first and second contact holes 21 and 22 may be self-aligned with the spacer 19. The first contact hole 21 may be recessed so that the bottom thereof is positioned below the surface of the substrate 11. Accordingly, the bottom of the first contact hole 21 may extend into the isolation layer 12. The first contact hole 21 may not penetrate the isolation layer 12. The bottom of the second contact hole 22 may be positioned below the surface of the substrate 11. The bottom of the second contact hole 22 may extend into the second impurity region 18. The second contact hole 22 may not penetrate the second impurity region 18. The surface of the isolation layer 12 may be recessed during the formation of the first contact hole 21 (R1), and the surface of the second impurity region 18 may be recessed during the formation of the second contact hole 22 (R2). The bottom of the first contact hole 21 may be positioned at a deeper level than the bottom of the second contact hole 22. In some embodiments, (NOT SHOWN), the bottom of the first contact hole 21 may be disposed at the same level as the bottom of the second contact hole 22.

A trench-based dielectric material 12A may be formed by the first contact hole 21, and the trench-based dielectric material 12A may include a gap-fill portion GP and a rupture portion RP. The rupture portion RP may be disposed in the dielectric material edge 12E. The rupture portion RP may contact the active region edge 14E. The rupture portion RP may contact the first impurity region 17. The rupture portion RP and the first impurity region 17 may have the same width and/or depth. The rupture portion RP and the first impurity region 17 may have different widths and/or depths. The trench-based dielectric material 12A may serve as the isolation layer.

Figure 8G:
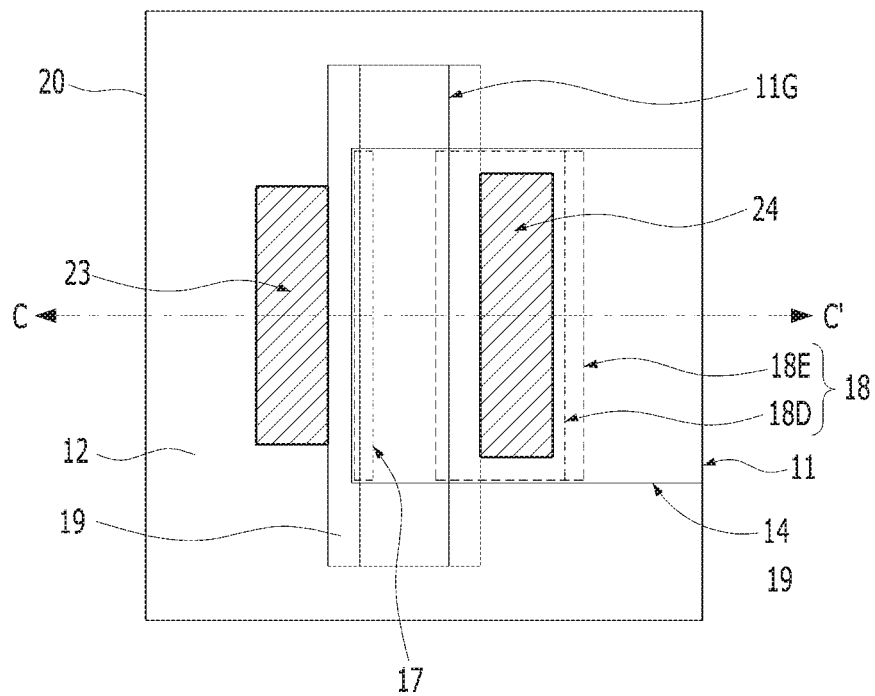
Figure 9G:
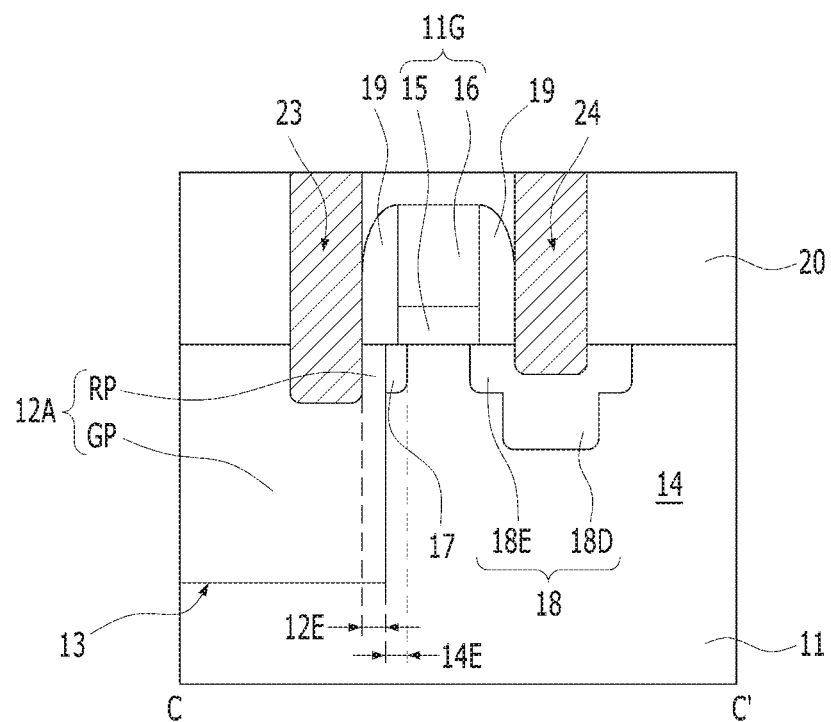

Referring to FIGS. 8G and 9G, a first contact plug 23 may be formed in the first contact hole 21. While the first contact plug 23 is formed, a second contact plug 24 may be formed in the second contact hole 22.

The first contact plug 23 may contact the trench-based dielectric material 12A. The first contact plug 23 may contact the rupture portion RP, and the second contact plug 24 may contact the second impurity region 18. The first contact plug 23 may contact the first spacer 19 and be self-aligned with a sidewall of the first spacer 19. The second contact plug 24 may contact the second spacer 19 and be self-aligned with a side wall of the second spacer 19.

Figure 8H:
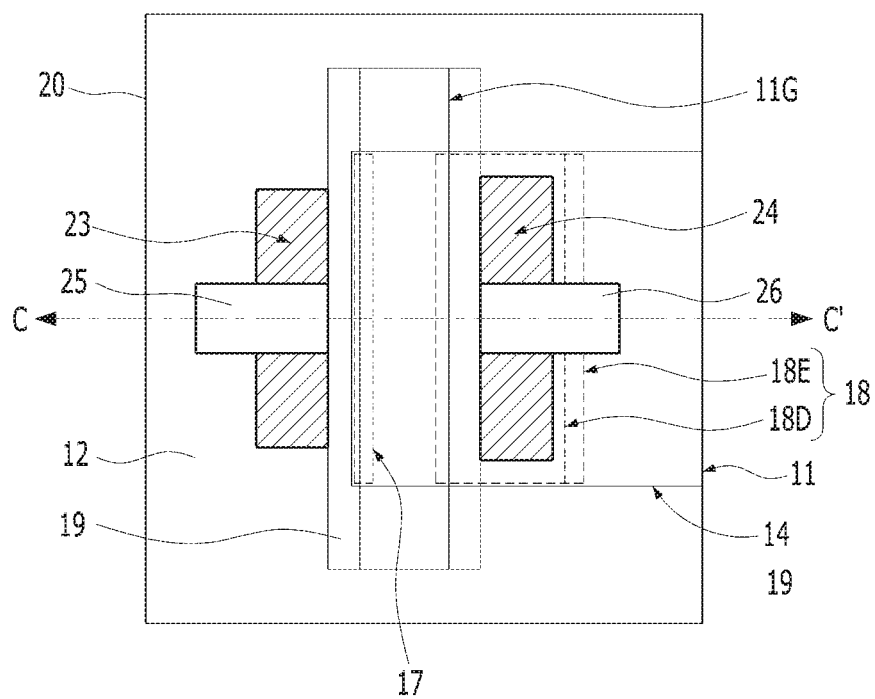
Figure 9H:
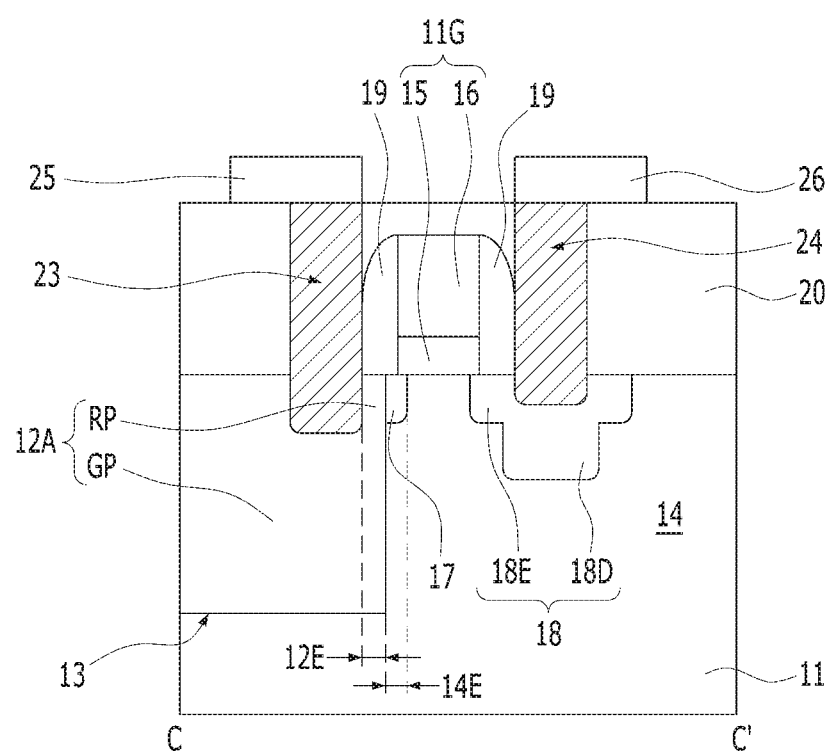

Referring to FIGS. 8H and 9H, a first metal wiring 25 may be formed on the first contact plug 23. A second metal wiring 26 may be formed on the second contact plug 24. The first and second metal wirings 25 and 26 may be formed using any one of a number of well-known steps. For example, a metal wiring layer may be formed on the interlayer dielectric layer 20 and the formed first and second contact plugs 23 and 24 and then using a mask the metal wiring layer may be etched to form the first and second metal wirings 25 and 26.

FIGS. 10A to 10E are diagrams for describing an example of a method for fabricating a semiconductor device in accordance with an embodiment of the present invention. FIGS. 10A to 10E illustrate an example of the method for fabricating the semiconductor device shown in FIG. 6.

Figure 10A:
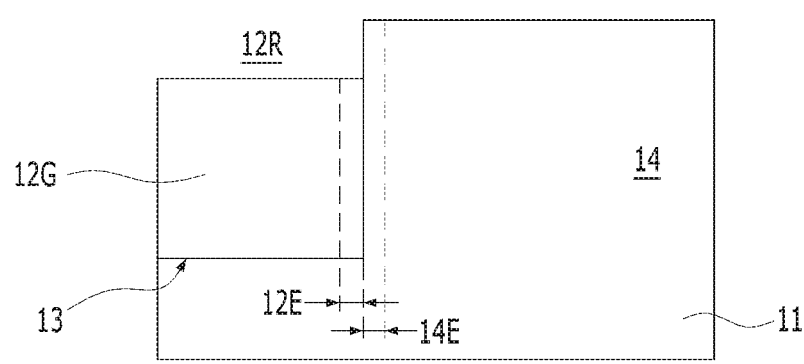
FIGS. 10A to 10E are diagrams for describing an example of a method for fabricating a semiconductor device in accordance with an embodiment of the present invention.

Referring to FIG. 10A, a lower gap-fill material 12G may be formed in a substrate 11. The lower gap-fill material 12G may be formed by the STI process. For example, after a trench 13 is formed by etching a portion of the substrate 11, the lower gap-fill material 12G may be formed by filling the trench 13 with a dielectric material. The lower gap-fill material 12G and the trench 13 may define an active region 14 in the substrate 11. The lower gap-fill material 12G may be disposed on a dielectric material edge 12E, and contact an active region edge 14E.

Subsequently, the lower gap-fill material 12G may be recessed at a lower level than a top surface of the active region 14 to form a space or gap 12R at an upper portion of the trench 13 above the lower gap-fill material 12G. An etch-back process may be performed to recess the lower gap-fill material 12G.

Figure 10B:
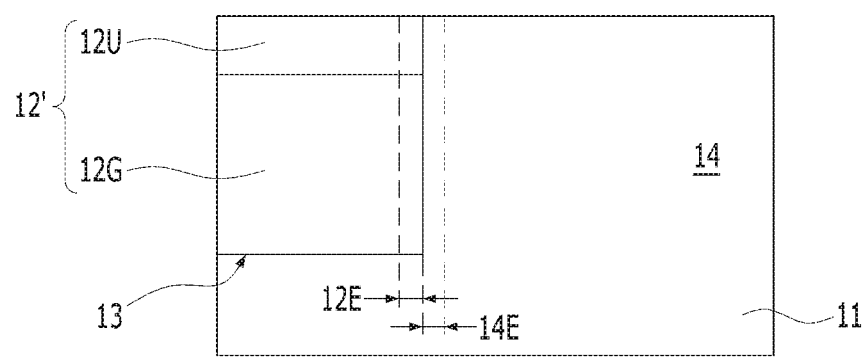

Referring to FIG. 10B, an upper gap-fill material 12U may be formed. The upper gap-fill material 12U may be formed on the lower gap-fill material 12G. In order to form the upper gap-fill material 12U, the space 12R may be filled with a dielectric material, and then planarized.

An isolation layer 12' may include the lower gap-fill material 12G and the upper gap-fill material 12U. The upper gap-fill material 12U may preferably include oxide, nitride or a combination thereof. The lower gap-fill material 12G may preferably include oxide. The lower gap-fill material 12G may fill a lower portion of the trench 13, and the upper gap-fill material 12U may fill an upper portion of the trench 13 on the lower gap-fill material 12G. The upper gap-fill material 12U may have a top surface at the same level as the top surface of the substrate 11.

Figure 10C:
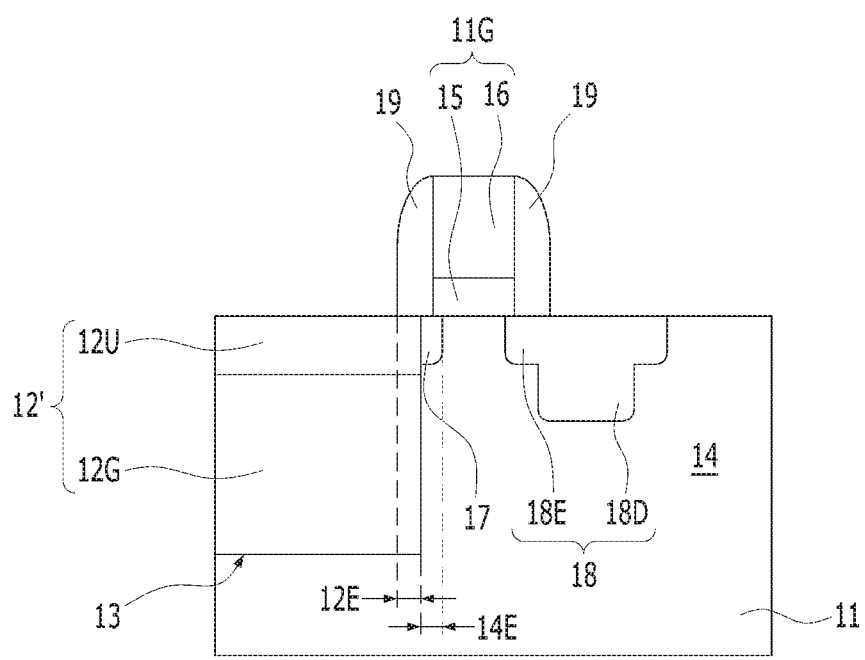

Referring to FIG. 10C, a gate structure 11G may be formed on a surface of the substrate 11. The gate structure 11G may have a structure in which a gate dielectric layer 15 and a gate electrode 16 are sequentially stacked.

An impurity doping process may be performed using the gate structure 11G as a barrier to form a first impurity region 17 and a shallow impurity region 18E. The first impurity region 17 and the shallow impurity region 18E may include the same conductive type of impurity. The first impurity region 17 and the shallow impurity region 18E may have the same depth. The first impurity region 17 and the shallow impurity region 18E may have asymmetric shapes having different widths. The first impurity region 17 may be formed in the active region edge 14E. The first impurity region 17 may contact the dielectric material edge 12E. The first impurity region 17 may contact the upper gap-fill material 12U.

A spacer 19 including first and second spacers 19 may be formed on both sidewalls of the gate structure 11G. An etch-back process may be performed to form the spacer 19 after a spacer material is deposited on the gate structure 11G. The spacer 19 may, for example, include silicon oxide, silicon nitride or a combination thereof. A bottom surface of the first spacer 19 may contact the active region edge 14E and the dielectric material edge 12E. The bottom of the first spacer 19 may contact the upper gap-fill material 12U. A bottom surface of the second spacer 19 may contact the shallow impurity region 18E.

An impurity doping process may be performed using the gate structure 11G and the spacer 19 as barriers to form a deep impurity region 18D. The deep impurity region 18D may include the same conductive type of impurity as the shallow impurity region 18E. The deep impurity region 18D may be deeper than the first impurity region 17 and the shallow impurity region 18E. The deep impurity region 18D may be spaced apart from the dielectric material edge 12E and the active region edge 14E.

The deep impurity region 18D and the shallow impurity region 18E may constitute a second impurity region 18. The first and second impurity regions 17 and 18 may have asymmetric shapes having different widths. The first and second impurity regions 17 and 18 may have asymmetric shapes having different depths.

Figure 10D:
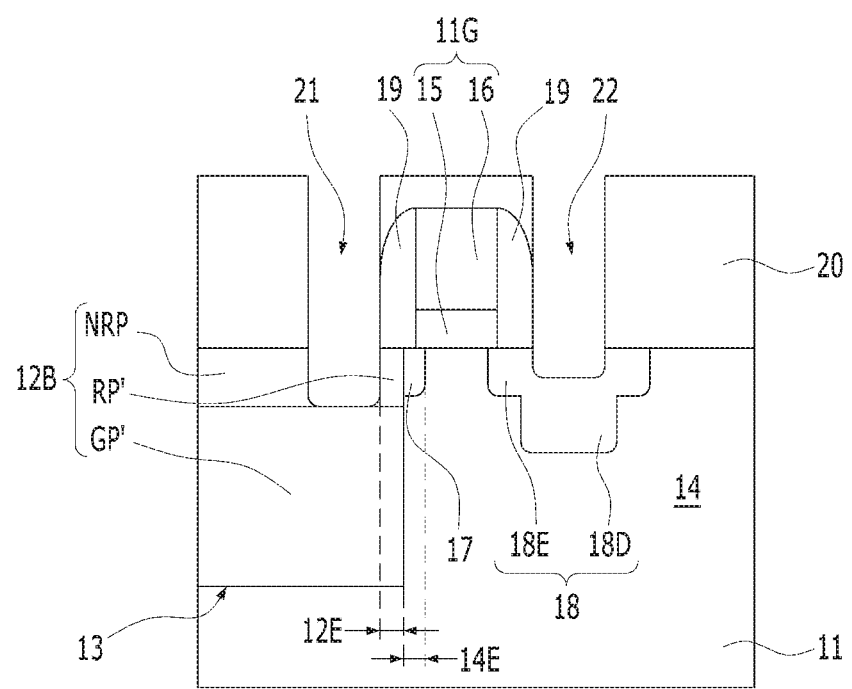

Referring to FIG. 10D, an interlayer dielectric layer 20 may be formed on the spacer 19 and the gate structure 11G. The interlayer dielectric layer 20 may, for example, include silicon oxide.

Subsequently, a contact mask layer (not illustrated) may be formed on the interlayer dielectric layer 20 and the interlayer dielectric layer 20 may be etched using the contact mask layer as an etch barrier to form contact holes 21 and 22. The second impurity region 18 below the contact hole 22 may be partially etched to extend the contact hole 22 downwardly. Likewise, the isolation layer 12' below the contact hole 21 may be partially etched to extend the contact hole 21 downwardly.

The contact holes 21 and 22 may be referred to as the first contact hole and the second contact hole 22. The first contact hole 21 may be landed on a surface of the isolation layer 12', and the second contact hole 22 may be landed on a surface of the second impurity region 18. The first and second contact holes 21 and 22 may be self-aligned with the spacer 19. The first contact hole 21 may be recessed so that the bottom thereof is positioned below the surface of the substrate 11. Accordingly, the bottom of the first contact hole 21 may be extended inside the isolation layer 12'. The first contact hole 21 may not penetrate the isolation layer 12'. The bottom of the second contact hole 22 may be positioned below the surface of the substrate 11. The bottom of the second contact hole 22 may extend into the second impurity region 18. The second contact hole 22 may not penetrate the second impurity region 18. The surface of the isolation layer 12' may be recessed during the formation of the first contact hole 21, and the surface of the second impurity region 18 may be recessed during the formation of the second contact hole 22. The bottom of the first contact hole 21 may be positioned at a deeper level than the bottom of the second contact hole 22. In some embodiments, the bottom of the first contact hole 21 may be positioned at the same level as the bottom of the second contact hole 22.

A trench-based dielectric material 12B may be formed by the first contact hole 21, and include a gap-fill portion GP' and a rupture portion RP'. The rupture portion RP' may be disposed in the dielectric material edge 12E. The rupture portion RP' may contact the active region edge 14E. The rupture portion RP' may contact the first impurity region 17. The rupture portion RP' and the first impurity region 17 may have the same width and/or depth. The rupture portion RP' and the first impurity region 17 may have different widths and/or depths.

The rupture portion RP' may be formed by etching the upper gap-fill material 12U. The gap-fill portion GP' may be defined by the lower gap-fill material 12G. The trench-based dielectric material 12B may serve as the isolation layer. The trench-based dielectric material 12B may further include a non-rupture portion NRP.

Figure 10E:
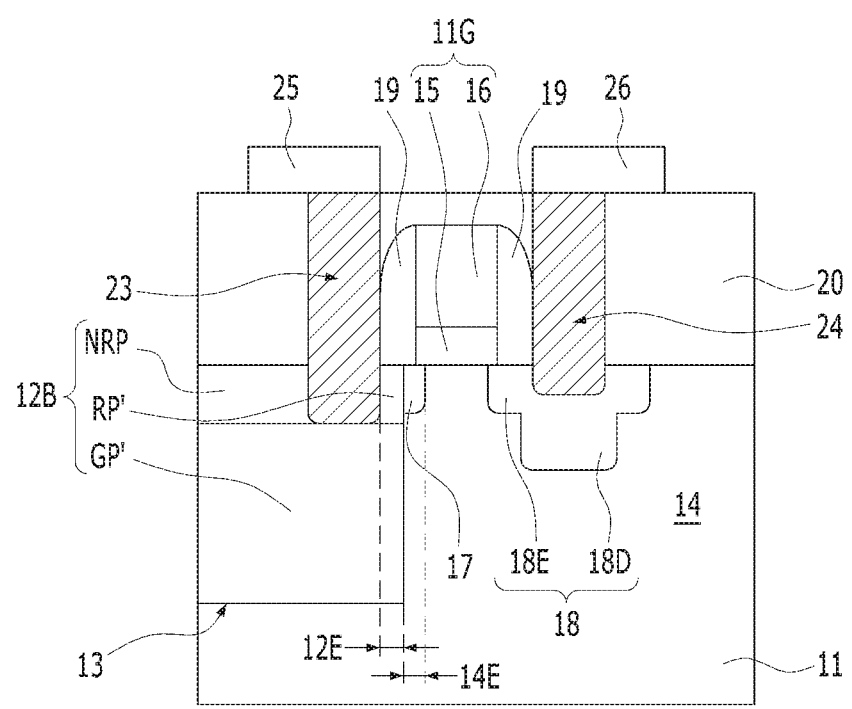

Referring to FIG. 10E, a first contact plug 23 may be formed in the first contact hole 21. While the first contact plug 23 is formed, a second contact plug 24 may be formed in the second contact hole 22.

The first contact plug 23 may contact the trench-based dielectric material 12B. The first contact plug 23 may contact the rupture portion RP'. The second contact plug 24 may contact the second impurity region 18. The first contact plug 23 may contact the first spacer 19, and be self-aligned with a sidewall of the first spacer 19. The second contact plug 24 may contact the second spacer 19, and be self-aligned with a side wall of the second spacer 19.

A first metal wiring 25 may be formed on the first contact plug 23. A second metal wiring 26 may be formed on the second contact plug 24.

FIGS. 11A to 11D are diagrams for describing an example of a method for fabricating a semiconductor device in accordance with an embodiment of the present invention. FIGS. 11A to 11D illustrate an example of the method for fabricating the semiconductor device shown in FIG. 7.

Figure 11A:
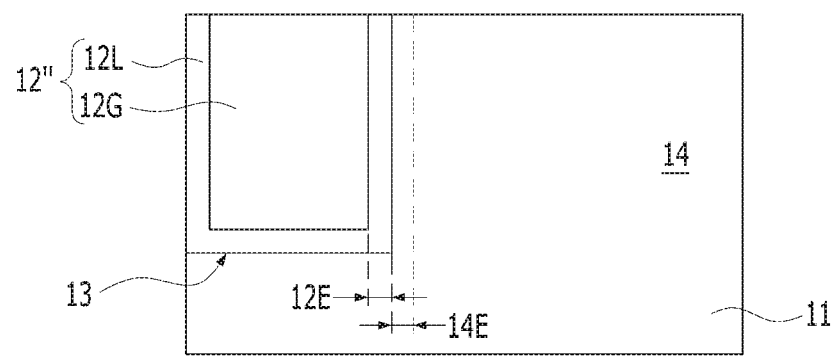
FIGS. 11A to 11D are diagrams for describing an example of a method for fabricating a semiconductor device in accordance with an embodiment of the present invention.

Referring to FIG. 11A, an isolation layer 12" may be formed in a substrate 11. The isolation layer 12" may be formed by the STI process. For example, after a trench 13 is formed by etching a portion of the substrate 11, the isolation layer 12" may be formed by filling the trench 13 with a dielectric material. The isolation layer 12" may define an active region 14 in the substrate 11.

The isolation layer 12" may include a gap-fill material 12G and a liner 12L. The liner 12L may preferably include oxide, nitride or a combination thereof. The gap-fill material 12G may preferably include oxide. The liner 12L may be disposed on a dielectric material edge 12E, and contact an active region edge 14E.

Figure 11B:
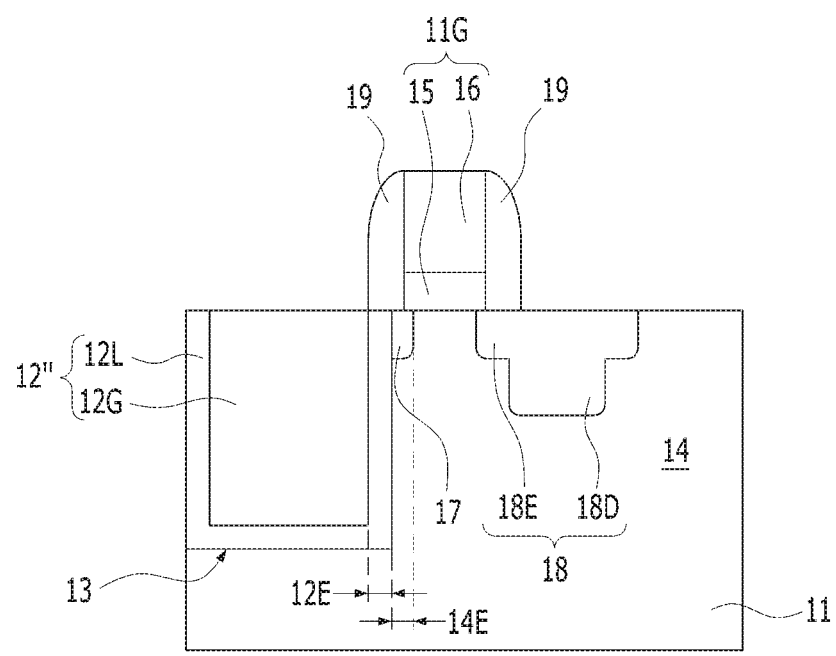

Referring to FIG. 11B, a gate structure 11G may be formed on a surface of the substrate 11. The gate structure 11G may have a structure in which a gate dielectric layer 15 and a gate electrode 16 are sequentially stacked.

An impurity doping process may be performed using the gate structure 11G as a barrier to form a first impurity region 17 and a shallow impurity region 18E. The first impurity region 17 and the shallow impurity region 18E may include the same conductive type of impurity. The first impurity region 17 and the shallow impurity region 18E may have the same depth. The first impurity region 17 and the shallow impurity region 18E may have asymmetric shapes having different widths. The first impurity region 17 may be formed in the active region edge 14E. The first impurity region 17 may contact the dielectric material edge 12E.

A spacer 19 including first and second spacers may be formed on both sidewalls of the gate structure 11G. An etch-back process may be performed to form the spacer 19 after a spacer material is deposited on the gate structure 11G. The spacer 19 may, for example, include silicon oxide, silicon nitride or a combination thereof. A bottom surface of the first spacer 19 may contact the active region edge 14E and the dielectric material edge 12E. A lower portion of the spacer 19 may contact the liner 12L. A bottom surface of the second spacer 19 may contact the shallow impurity region 18. An impurity doping process may be performed using the gate structure 11G and the spacer 19 as barriers to form a deep impurity region 18D. The deep impurity region 18D may include the same conductive type of impurity as the shallow impurity region 18E. The deep impurity region 18D may be deeper than the first impurity region 17 and the shallow impurity region 18E. The deep impurity region 18D may be spaced apart from the dielectric material edge 12E and the active region edge 14E.

The deep impurity region 18D and the shallow impurity region 18E may constitute a second impurity region 18. The first and second impurity regions 17 and 18 may have asymmetric shapes having different widths. The first and second impurity regions 17 and 18 may have asymmetric shapes having different depths.

Figure 11C:
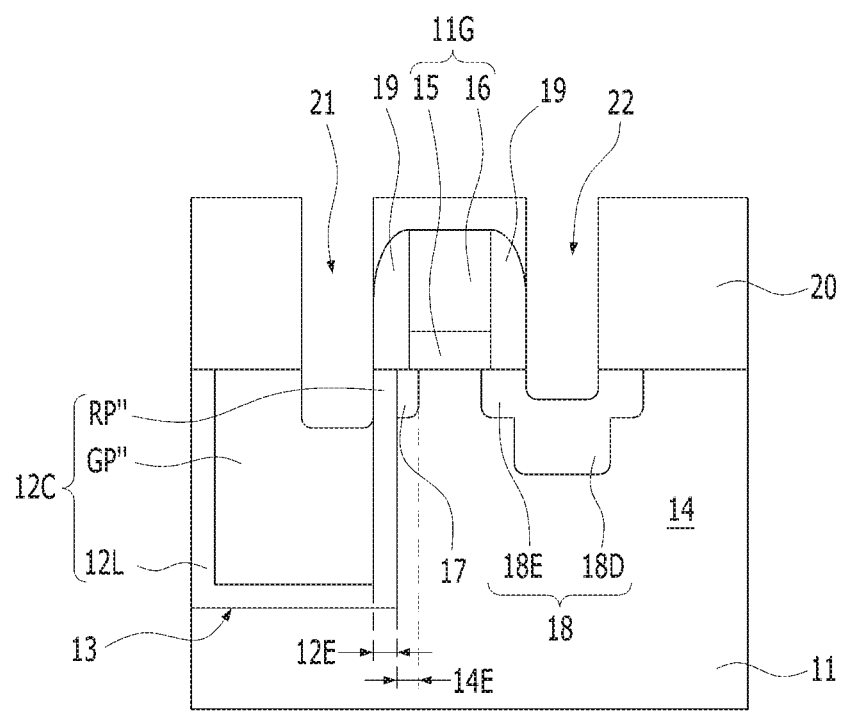

Referring to FIG. 11C, an interlayer dielectric layer 20 may be formed on the spacer 19 and the gate structure 11G. The interlayer dielectric layer 20 may, for example, include silicon oxide.

Subsequently, a contact mask layer (not illustrated) may be formed on the interlayer dielectric layer 20 and the interlayer dielectric layer 20 may be etched using the contact mask layer as an etch barrier to form contact holes 21 and 22. The isolation layer 12" and the second impurity region 18 below the contact holes 21 and 22 may be partially etched to extend the contact holes 21 and 22 downwardly.

The contact holes 21 and 22 may be referred to as the first contact hole and the second contact hole 22. The first contact hole 21 may be landed on a surface of the isolation layer 12", and the second contact hole 22 may be landed on a surface of the second impurity region 18. The first and second contact holes 21 and 22 may be self-aligned with the spacer 19. The first contact hole 21 may be recessed so that the bottom thereof is positioned below the surface of the substrate 11. Accordingly, the bottom of the first contact hole 21 may extend into the isolation layer 12". The first contact hole 21 may not penetrate the isolation layer 12". The bottom of the second contact hole 22 may be positioned below the surface of the substrate 11. The bottom of the second contact hole 22 may extend into the second impurity region 18. The second contact hole 22 may not penetrate the second impurity region 18. The surface of the isolation layer 12" may be recessed during the formation of the first contact hole 21, and the surface of the second impurity region 18 may be recessed during the formation of the second contact hole 22. The bottom of the first contact hole 21 may be positioned at a deeper level than the bottom of the second contact hole 22. In some embodiments, the bottom of the first contact hole 21 may be positioned at the same level as the bottom of the second contact hole 22.

A trench-based dielectric material 12C may be formed by the first contact hole 21, and include the liner 12L, a gap-fill portion GP'" and a rupture portion RP'". The rupture portion RP'" may be disposed in the dielectric material edge 12E. The rupture portion RP'" may contact the active region edge 14E. The rupture portion RP'" may contact the first impurity region 17. The rupture portion RP'" and the first impurity region 17 may have the same width and/or depth. The rupture portion RP'" and the first impurity region 17 may have different widths and/or depths.

The rupture portion RP'" may be a portion of the liner 12L. The gap-fill portion GP'" may be formed by recessing the gap-fill material 12G. The trench-based dielectric material 12C may serve as the isolation layer.

Figure 11D:
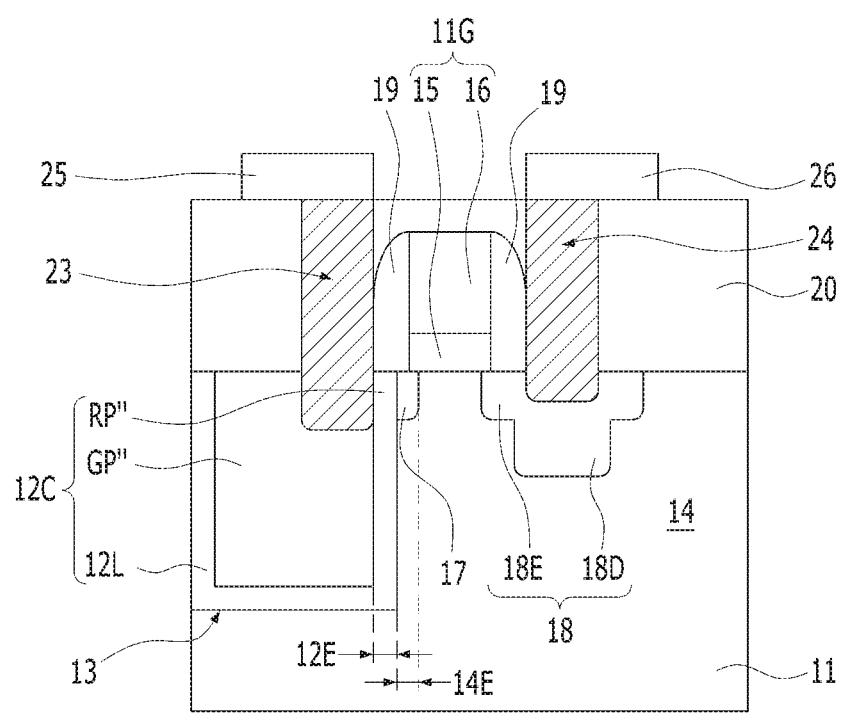

Referring to FIG. 11D, a first contact plug 23 may be formed in the first contact hole 21. While the first contact plug 23 is formed, a second contact plug 24 may be formed in the second contact hole 22.

The first contact plug 23 may contact the trench-based dielectric material 12C. The first contact plug 23 may contact the rupture portion RP", and the second contact plug 24 may contact the second impurity region 18. The first contact plug 23 may contact the first spacer 19, and be self-aligned with a sidewall of the first spacer 19. The second contact plug 24 may contact the second spacer 19, and be self-aligned with a side wall of the spacer 19.

A first metal wiring 25 may be formed on the first contact plug 23. A second metal wiring 26 may be formed on the second contact plug 24.

In accordance with the present embodiments, as the semiconductor device includes one select transistor with the rupture portion disposed in the isolation layer, the area occupied by the anti-fuse may be reduced.

In accordance with the present embodiments, since the rupture portion of the trench-based dielectric material is ruptured through the contact plug, the anti-fuse may operate stably.

The embodiments of the present invention described above are not only implemented by devices and methods but may be implemented through programs realizing the functions corresponding to the configurations according to the embodiments or recording media on which the programs are recorded. The embodiments may be easily implemented by those skilled in the art from the description of the embodiments described above.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A semiconductor device comprising:
a trench formed in a substrate;
an active region defined in the substrate by the trench;
an isolation layer formed in the trench, and including a rupture portion contacting an edge of the active region;
a first conductive plug formed on the isolation layer so as to contact the rupture portion; and
a gate structure including a gate dielectric layer formed on the active region and a gate electrode formed on the gate dielectric layer,
wherein the isolation layer is positioned in the substrate at a lower level than that of the gate structure,
wherein the isolation layer includes a liner formed over the trench, and a gap-fill material filling the trench over the liner,
wherein the rupture portion is formed at a portion of the liner which is in contact with the first conductive plug,
wherein the rupture portion is disposed laterally between a lower portion of the first conductive plug and the edge of the active region, and
wherein the rupture portion is direct contact with a lower portion of the first conductive plug and is not in contact with the edge of the active region.

2. The semiconductor device of claim 1, wherein the isolation layer further includes a gap-fill material filling a lower portion of the trench, and the rupture portion has a vertically upward shape from the gap-fill material.

3. The semiconductor device of claim 1, wherein the semiconductor device includes an anti-fuse, the first conductive plug is driven as a program gate for rupturing the rupture portion, and the gate structure is driven as a select gate.

4. The semiconductor device of claim 1, wherein the active region includes a channel, the channel is formed in the active region below the gate dielectric layer when the rupture portion is ruptured.

5. The semiconductor device of claim 1, wherein the rupture portion of the isolation layer has a width that is smaller than the thickness of the gate dielectric layer.

6. The semiconductor device of claim 1, wherein the rupture portion of the isolation layer includes silicon oxide, silicon nitride or a combination thereof.

7. The semiconductor device of claim 1, wherein the first conductive plug has a smaller width than the trench, and is disposed on the isolation layer.

8. The semiconductor device of claim 1, wherein the first conductive plug includes a silicon-based material, a metal-based material or a combination thereof.

9. The semiconductor device of claim 1, further comprising a first and a second spacer formed on respective sidewalls of the gate structure,
wherein the first conductive plug is self-aligned with a sidewall of the first spacer.

10. The semiconductor device of claim 9, wherein a bottom surface of the first spacer directly contacts a top surface of the rupture portion and the edge of the active region.

11. The semiconductor device of claim 1, further comprising:
a first impurity region formed in the edge of the active region so as to contact the rupture portion;
a second impurity region formed in the active region so as to be spaced apart from the first impurity region; and
a channel region defined between the first and second impurity regions,
wherein the gate structure is disposed on the channel region.

12. The semiconductor device of claim 11, wherein the first and second impurity regions are of asymmetric shapes having different depths.

13. The semiconductor device of claim 11, wherein the first and second impurity regions are of asymmetric shapes having different widths.

14. The semiconductor device of claim 11, further comprising a second conductive plug in contact with the second impurity region.

15. The semiconductor device of claim 11, wherein the rupture portion and the first impurity region have the same depth.

16. The semiconductor device of claim 11, wherein the first impurity region includes a first shallow impurity region, and the second impurity region includes a second shallow impurity region having the same depth as the first shallow impurity region and a deep impurity region having a larger depth than the first and second shallow impurity regions.

17. The semiconductor device of claim 16, wherein each of the first and second shallow impurity regions includes a low-concentration impurity, and the deep impurity region includes a high-concentration impurity having a higher concentration than the low-concentration impurity,
wherein the low-concentration and high-concentration impurities have the same conductive type.

* * * * *